United States Patent
Williams et al.

(10) Patent No.: US 10,141,943 B1
(45) Date of Patent: Nov. 27, 2018

(54) HIGH SPEED ACQUISITION SYSTEM FOR PHASE LOCKED LOOPS

(71) Applicant: Teledyne Wireless, LLC, Thousand Oaks, CA (US)

(72) Inventors: Anthony David Williams, Aptos, CA (US); Gursewak Singh Rai, Morgan Hill, CA (US)

(73) Assignee: TELEDYNE DEFENSE ELECTRONICS, LLC, Thousand Oaks, CA (US)

( * ) Notice: Subject to any disclaimer, the term of this patent is extended or adjusted under 35 U.S.C. 154(b) by 0 days.

(21) Appl. No.: 15/901,682

(22) Filed: Feb. 21, 2018

(51) Int. Cl.
H03L 7/093 (2006.01)
H03L 7/107 (2006.01)
H03L 7/183 (2006.01)

(52) U.S. Cl.
CPC .............. *H03L 7/183* (2013.01); *H03L 7/093* (2013.01); *H03L 7/1075* (2013.01)

(58) Field of Classification Search
CPC ......... H03L 7/085; H03L 7/093; H03L 7/107; H03L 7/1075; H03L 7/0783
See application file for complete search history.

(56) References Cited

U.S. PATENT DOCUMENTS

| | | |
|---|---|---|
| 3,755,758 A | 8/1973 | Leeson |
| 4,935,706 A * | 6/1990 | Schenberg .............. H03L 7/189 331/11 |
| 5,334,952 A * | 8/1994 | Maddy .................... H03L 7/189 331/1 A |
| 6,960,947 B2 * | 11/2005 | Albasini .............. H03L 7/1976 327/147 |
| 7,038,507 B2 | 5/2006 | Williams |
| 7,656,236 B2 * | 2/2010 | Williams ............... H03L 7/087 331/1 R |
| 7,961,833 B2 * | 6/2011 | Albasini .............. H03L 7/0891 375/376 |

OTHER PUBLICATIONS

Gardner, Floyd M., Phaselock Techniques, Wiley & Sons, Inc., 1966, pp. 197-199.
Elliot, Rod, Using CUrrent Sources, Sinks & Mirrors in Audio, Jan. 6, 2012, 19 pages.
7SB384 Bus Switch, ON Semiconductor ©, Semiconductor Components Industries, LLC, Mar. 2011, Rev. 2, 10 pages.
Brennan, Paul V., Phase-Locked Loops, Principles and Practice, McGraw Hill, 1996, pp. 90-92.

(Continued)

*Primary Examiner* — Patrick O'Neill
(74) *Attorney, Agent, or Firm* — K&L Gates LLP

(57) ABSTRACT

A signal generator is disclosed that in one form employs an indirect digital-to-analog converter (DAC) assisted frequency synthesizer for switching a steering current into or out of a phase locked loop (PLL) filter capacitor. The signal generator provides fast switching performance and loop bandwidth adjustment to reduce phase noise and improve phase jitter performance. The signal generator comprises a channel signal selector, a digital-to-analog converter, a window generator circuit, a window comparator, a steering current circuit, a PLL circuit with voltage controlled oscillator (VCO), programmable divider, and a reference oscillator.

22 Claims, 10 Drawing Sheets

(56) References Cited

OTHER PUBLICATIONS

Clayton, George and Steve Winder, Operational Amplifiers, Newnes, 4th ed., 2000, pp. 144-145.
Helszajn, J., YIG Resonators and Filters, John Wiley & Sons, 1985, pp. 191-201.
Manassewitsch, Vadim, Frequency Synthesizers, Voltage-Controlled Oscillator Tuning Circuits, John Wiley & Sons, 1980, pp. 431-436.
Manassewitsch, Vadim, Frequency Synthesizers, Theory and Design, John Wiley & Sons, 1980, pp. 438-511.
Gorski-Popiel et al., Frequency Synthesis: Techniques and Applications, IEEE Press, 1975, pp. 69-149.

* cited by examiner

HIGH SPEED ACQUISITION SYSTEM FOR PHASE LOCKED LOOPS

BACKGROUND

The present disclosure is directed to generally to a frequency synthesizer. Several types of frequency synthesizers are known. The first and second types are stand-alone architecture direct analog frequency synthesizers (also called a mix-filter-divide architecture) and the more modern direct digital synthesizers (DDS) (table-look-up). The third type is referred to an indirect digital phase-locked loop (PLL) synthesizers, which include integer-N and fractional-N counters. The indirect digital PLL synthesizer receives a reference oscillator input and a digital frequency control word and sets the output frequency.

A direct frequency synthesizer has multiple fixed-frequency sources feeding into a switch, which outputs a desired frequency. A direct frequency synthesizer may use a PLL and a steering current circuit to achieve output frequency lock. Although a direct frequency synthesizer exhibits good rapid frequency switching performance, direct frequency synthesizers can become large and complex for a range of output frequencies. In addition, the frequency output signal can be spurious due to multiple signal sources running continuously. A frequency mixer is a type of direct frequency synthesizer, and it improves upon signal stability. It receives signals from different sources, such as the switch output of a direct frequency synthesizer and the output of a DDS, and combines them in a frequency mixer to produce an output having components of both input signals. A band-pass filter can then be used to select the desired frequency from the mixer. These devices are good for producing pure signals that are stable, and are able to change frequencies rapidly. However, they are large, complex, and expensive.

There are different methods of generating a signal of known output frequency with an indirect PLL frequency synthesizer. A digital-to-analog converter (DAC) can be used to receive a digital frequency control word and output an analog voltage signal to the tuning port of a voltage controlled oscillator (VCO). Also known as a digitally tuned oscillator, this circuit exhibits good performance for fast frequency tuning but lacks frequency stability, both long term and short term frequency stability. The present disclosure provides various signal generator circuits including DAC-assisted frequency synthesizers that provide for low noise, fast switching, and stable frequency and phase performance.

SUMMARY

In one aspect, the present disclosure provides a signal generator. The signal generator comprising a voltage window generator to receive an analog frequency select signal from a digital-to-analog converter (DAC) and to generate a first reference threshold voltage and a second reference threshold voltage based on the analog frequency select signal; a window comparator coupled to the voltage window generator, the window comparator to receive a voltage controlled oscillator (VCO) tuning voltage from a phase locked loop (PLL), receive the first and second reference threshold voltages from the voltage window generator, and generate a first steering current control signal and a second steering current control signal; and a steering current circuit coupled to the window comparator, the steering current circuit to receive the first and second steering current control signals to control a steering current coupled to a PLL and apply a phase comparator/detector signal to an PLL based on the first and second steering current control signals.

In another aspect, the present disclosure provides a method of generating a signal. The method comprising: receiving, by a processor/logic, a frequency change request; loading, by the processor/logic, a frequency control word into a programmable counter circuit of a phase comparator/detector; loading, by the processor/logic, the frequency control word into a digital-to-analog converter (DAC) coupled to the processor/logic; controlling, by a steering current circuit, a steering current into or out of a loop filter capacitor portion of a loop filter coupled to the steering current circuit based on the frequency control word; and generating, by the loop filter, a tuning voltage based on the steering current.

In another aspect, the present disclosure provides a signal generator. The signal generator comprising: a processor/logic; a memory coupled to the processor/logic, the memory stores digital control words; a digital-to-analog converter (DAC) coupled to the memory circuit; a voltage window generator coupled to the DAC; a window comparator coupled to the voltage window generator circuit; a steering current circuit coupled to the window comparator; and a phase-lock-loop (PLL) circuit coupled to the memory and the steering current circuit, the PLL circuit further comprising: a programmable counter; a loop filter comprising a loop filter capacitor, the a loop filter coupled to the steering current circuit; a phase comparator/detector circuit; and a voltage controlled oscillator (VCO); wherein the memory stores digital instructions executable by the processor to: receive a frequency change request; load a frequency control word into the programmable counter circuit; and load the frequency control word into the DAC; wherein the steering current circuit is configured to control a steering current into or out of the loop filter capacitor based on the new frequency control word; and wherein the loop filter is configured to generate a tuning voltage based on the steering current.

FIGURES

The features of various aspects are set forth with particularity in the appended claims. The various aspects, however, both as to organization and methods of operation may best be understood by reference to the following description, taken in conjunction with the accompanying drawings as follows.

DESCRIPTION

Figure 1:
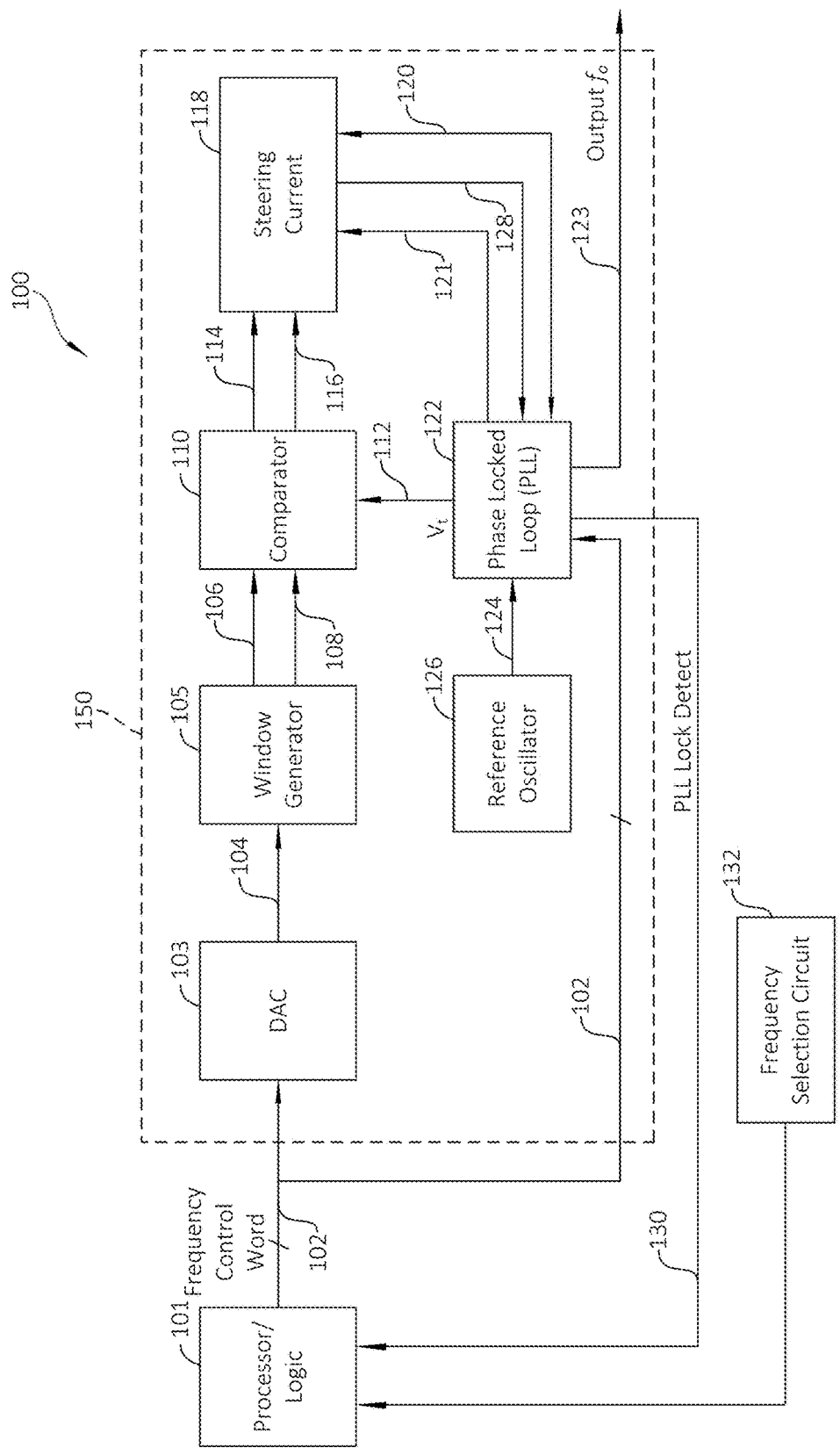
FIG. 1 illustrates a signal generator comprising a frequency synthesizer according to one aspect of the present disclosure.

Digitally controlled signal sources are often configured to change frequency rapidly. Digitally Tuned Oscillators (DTOs) are often used in which the tuning port of a VCO is driven from the output of a DAC whose input is a digital frequency control word specifying the output frequency. Devices of this type exhibit fast frequency tuning, but can have poor short and long term frequency stability performance.

Another family of devices employs direct frequency synthesis whereby a multi-way switch is used to commutate between several, equispaced fixed frequency sources to produce an output signal that may be switched across a frequency band in equal steps. Devices of this type may be made to switch very rapidly and can become very large and complex when multiple output frequencies are employed; also spurious outputs may be a problem when several signal sources run continuously.

Other "Direct Frequency Synthesizers" employ frequency mixers where the output of a simple switched source direct synthesizer is fed to one input of a mixer; the other input to the mixer may be derived from a DDS. The output signal from the mixer will contain signals whose frequencies equate to the sum and difference of the two input frequencies. The output from the mixer can be fed to a bank of band-pass filters using two multi-way switches in order to select a frequency output from the mixer.

These families of frequency synthesizers are known as "Hybrid Direct" synthesizers and are capable of producing signals of good spectral purity and stability; they also can be made to change frequency very rapidly. Hybrid direct synthesizers, however, are generally large, complex, and expensive.

"Indirect Frequency Synthesizers" generally employ PLL techniques to lock the frequency and phase of some form of electronically tunable oscillator to a reference oscillator (usually a crystal oscillator). The frequency of a signal generated using a PLL is very stable and will exhibit the same long term stability as that of the crystal reference oscillator in parts per million (ppm).

Short term stability, often described as frequency modulation noise or phase noise of such a source is primarily controlled by three factors: (1) the phase noise performance of the crystal reference oscillator versus offset from its carrier frequency; (2) the figure of merit (FOM) or phase comparator noise floor (PCNF) of the PLL phase detector; and (3) the phase noise performance of the tunable oscillator versus offset from the carrier frequency.

These parameters may be combined to generate a theoretical phase noise profile for the PLL. An overall measure of the "quality" of the performance of a PLL is the area defined under a phase noise profile curve, which represents the integrated phase jitter of the signal source. The phase jitter performance of a PLL may be minimized by setting the loop bandwidth of the feedback loop to a value where the loop has a gain of unity when the tunable oscillator profile crosses that of the phase comparator. This value of loop bandwidth is optimum for minimizing phase jitter and tends to be rather low; approximately 50 to 100 kHz in a simple microwave PLL. Unfortunately, the switching time (the time taken for the PLL to change from one frequency to another to another frequency) is inversely proportional to loop bandwidth, meaning that it exhibits a rather slow switching time characteristic. To implement a fast increase switching PLL, the loop bandwidth is increased beyond the optimum value. Unfortunately, this will increase the integrated phase jitter and, in some applications, will increase the phase noise level at a large offset from the carrier frequency.

Loop steering current techniques often employed in PLL circuits make use of analog mixers (often double balanced mixers) as phase detectors exploiting the property that when the signal and local oscillator ports of such a mixer are fed with two signals at the same frequency the signal at the IF port will comprise the sum and difference of the two input signal frequencies. Since the two input frequencies are the same, the difference will be a signal having zero frequency, i.e., a DC signal. This signal will have zero amplitude when the two input signals are exactly ninety degrees out of phase (i.e., they are in phase quadrature).

A mixer phase detector (analog phase detector) circuit can be used in a PLL. An oscillator having both manual and electronic tuning controls feeds the output port; a sample of the oscillator's output signal is fed to a programmable frequency divider. The divider produces an output signal at a fraction of the output signal such that the product of the inverse of that fraction and the reference frequency is equal to the desired output frequency. If the frequency of the oscillator is tuned manually the mixer will produce a signal whose frequency will reduce as the divided frequency nears the reference frequency. When this frequency is below the cut off frequency of the loop filter, the PLL will snap into lock, the lock detect meter will register a null and the manual tuning control will become inactive until the limit of the oscillator's electronic tuning range is reached whereupon the PLL will unlock. It will be appreciated that manual tuning control is inconvenient.

A PLL using an analog phase detector (mixer) could be forced into lock by inserting current (charging) into or withdrawing current (discharging) from the loop filter capacitor. When the PLL is in the unlocked condition the phase detector is effectively disconnected from the loop filter because the high frequency IF signal is blocked by an LC low-pass filter in the path. In this condition the loop filter behaves as a classical operational integrator and the oscillator tuning voltage will slew in a linear fashion. The direction of the slew is dependent on the direction of the "steering current," i.e., current flowing into the circuit will cause the tuning voltage to fall; current flowing out of the circuit will cause the tuning voltage to rise. The slew rate (volts per second) is determined by the magnitude of the steering current and the value of the loop filter capacitor.

The above steering current process may be automated by the addition of a voltage comparator circuit. This arrangement produces a low frequency triangular wave oscillation which sweeps the VCO towards its lock point whereupon the gain of the loop filter operational amplifier drops and the oscillation can no longer be sustained. This circuit may be used, for example, in dielectric resonator oscillators. A similar technique described in U.S. Pat. No. 7,038,507 B2 may be used where an auxiliary digital phase detector is used to produce the steering current to force the analog PLL into the phase locked condition. U.S. Pat. No. 7,038,507 is incorporated herein by reference in its entirety.

In various aspects, a digitally controlled signal source with a fast switching PLL may be implemented using a DAC assisted technique. This DTO technique may be used in frequency synthesizers built around Yttrium Iron Garnet (YIG) tuned oscillators. A YIG is a crystal that has very high Q characteristics. This high Q provides very low phase noise in oscillators and multi-octave frequency tuning for oscillators and filters. In one example, a YIG tuned oscillator (YTO) may have two frequency tuning coils enmeshed in a PLL circuit.

In a DAC assisted technique, a digital "frequency control word" is applied to the input of a DAC, which generates an analog output voltage. The analog output voltage is applied to a "main coil driver" circuit which serves as a voltage to current converter and drives current through the YTO main tuning coil. The oscillator is driven to a frequency close to the desired frequency by the main tuning which exhibits a tuning sensitivity of 10 MHz per milliamp of current flowing through it.

A sample of the YTO output signal is fed to a programmable divider whose division ratio is controlled by the digital frequency control word. The N divider output is fed to a digital phase comparator/detector circuit together with a reference oscillator signal usually derived from a crystal oscillator. The output of the phase comparator/detector circuit is fed to the YTO fine tuning coil (FM coil) via an active low-pass filter (the PLL loop filter) and FM coil driver in order to close the PLL.

The DAC assisted technique works well in YTO based frequency synthesizers because the main coil tuning circuitry can be designed to have a "low-pass" filter characteristic and is therefore capable of rejecting any noise generated in the tuning DAC. The DAC assisted techniques, however, are difficult to apply to VCO based frequency synthesizers particularly if the devices are required to change frequency in a short period of time. In a hypothetical DAC assisted VCO based synthesizer, noise is coupled directly to the VCO tuning port via the wide bandwidth summing amplifier to enable a fast switching PLL.

In various aspects, the present disclosure provides a digitally controlled signal generator with a fast switching PLL configured to provide rapid frequency tuning and long and short term phase and frequency stability. In other aspects, the present disclosure provides a digitally controlled signal source with a fast switching PLL configured to rapidly change frequency of reduced complexity and form factor to minimize or eliminate spurious outputs. In other aspects, the present disclosure provides a digitally controlled signal source with a fast switching PLL to minimize loop bandwidth to provide good phase noise and phase jitter performance while enabling the PLL to switch much more rapidly.

In various aspects, the present disclosure provides techniques for generating a frequency output signal with fast switching performance and reduced phase noise when switching from one frequency to another. More particularly, the present disclosure provides a PLL with a low loop bandwidth, and consequently low phase noise at large offsets from the carrier frequency, to enable the PLL to change frequency in a very short time.

In one aspect, the present disclosure provides a high speed acquisition system that employs an indirect DAC-assisted frequency synthesizer to receive the frequency and phase output of a tunable oscillator and lock it to a reference oscillator signal using a PLL method. In an indirect DAC-assisted frequency synthesizer the DAC is not directly connected to an oscillator tuning port and therefore does not degrade phase noise. The indirect DAC-assisted frequency synthesizer isolates the input signal selector and the PLL output. The isolation may be performed by a voltage window generator and a window comparator. A steering current circuit switches a high amplitude steering current into or out of a loop filter capacitor. The PLL is deliberately opened during the steering operation. The DAC is not connected directly to the oscillator tuning port and, therefore, does not degrade phase noise.

The PLL loop bandwidth can be set to a low value to minimize jitter and phase noise at large offsets from the carrier frequency. This produces very stable frequency signal outputs, and long term signal stability comparable to that of the reference oscillator itself, which generally is a crystal oscillator device. In various aspects, the present disclosure provides a digitally controlled signal generator with a fast switching PLL circuit configured to rapidly change frequency. The fast switching PLL circuit has a low loop bandwidth to minimize jitter and phase noise at large offsets from the carrier frequency.

FIG. 1 illustrates a signal generator 100 comprising a frequency synthesizer 150 according to one aspect of the present disclosure. In various aspects, the frequency synthesizer 150 is an indirect DAC-assisted frequency synthesizer comprising a digitally controlled signal source with a fast switching PLL 122. The PLL 122 is configured to rapidly change frequency while minimizing loop bandwidth, jitter, and phase noise at large offsets from the reference oscillator signal 124. In one aspect, the signal generator 100 comprises a processor/logic 101 coupled to the indirect DAC-assisted frequency synthesizer 150. The processor/logic 101 monitors a frequency selection circuit 132. The processor/logic 101 generators a digital frequency control word 102 that corresponds to the desired output signal frequency 124 ($f_o$) selected by the frequency select circuit 132.

The indirect DAC-assisted frequency synthesizer 150 comprises a DAC 103 to receive the frequency control word 102. The output of the DAC 103 is coupled to a voltage window generator 105. The voltage window generator 105 generates a voltage window threshold defined by first and second reference threshold voltages 106, 108 (upper and lower voltage boundaries) that are applied to the inputs of a comparator 110. The comparator 110 is coupled to a steering current circuit 118 and the PLL 122. The comparator 110 compares a tuning voltage 112 ($V_t$) of the PLL 122 to the first and second reference threshold voltages 106, 108 and controls the direction of a steering current 120 into or out of a loop filter capacitor of the PLL 122 based on the value of the tuning voltage 112 ($V_t$). Charging and discharging the loop filter capacitor with the steering current 120 increases the speed at which the PLL 122 reaches a locked condition after a new output frequency is selected by the frequency selection circuit 132. The processor/logic 101 also monitors a PLL lock detect output 130 from the PLL 122 to determine whether the PLL 122 is in the locked condition. The frequency selection circuit 132 may receive an input from a user or a machine (e.g., another circuit, processor, logic, etc.) to change the output frequency 123 ($f_o$) to a new specified output frequency 123 ($f_o'$).

In one aspect, the PLL 122 may be implemented by a LMX2492 500 MHz to 14 GHz wideband, low noise fractional N PLL with ramp/chirp generation, by Texas Instruments Inc. The processor/logic 101 may comprise a general purpose digital processor, controller, microcontroller, discrete logic devices, and/or combinations thereof. In one aspect, the processor/logic 101 may be fully integrated with the indirect DAC-assisted frequency synthesizer 150.

In one aspect, as described in connection with FIG. 11, the processor/logic 101 may be configured to monitor the output frequency 123 ($f_o$) of the indirect DAC-assisted frequency synthesizer 150 by monitoring the tuning voltage 112 ($V_t$) that produces the output frequency 123 ($f_o$). As described in FIG. 11, the tuning voltage 112 ($V_t$) may be coupled to the processor/logic 101 via an analog-to-digital converter 1102 (ADC). The ADC 1102 may be a high speed ADC and also may be integrated with the PLL 122. A voltage divider circuit or amplifier circuit may be located ahead of the ADC 1102 to produce a tuning voltage 112 ($V_t$) in a range that is compatible with the specifications of the ADC 1102.

Figure 2:
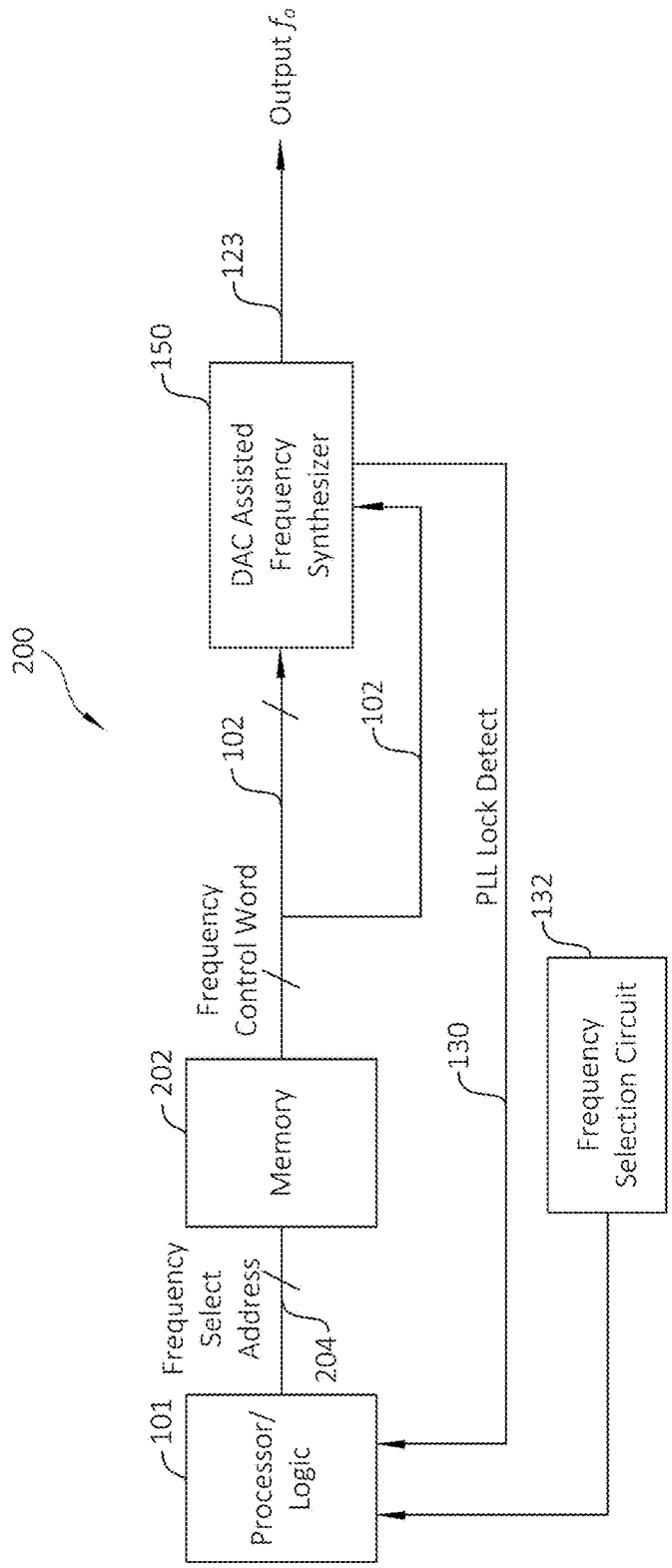
FIG. 2 illustrates a signal generator comprising a frequency synthesizer according to one aspect of the present disclosure.

With reference now back to FIG. 1, in one aspect, during operation, the processor/logic 101 continuously monitors the PLL lock detect output 130 and the frequency selection circuit 132 for a request to change the output frequency 123 ($f_o$). The request may be initiated manually by a user or may be provided by a machine (e.g., another circuit, processor, logic, etc.). When the processor/logic 101 detects a frequency change request from the frequency selection circuit 132, the processor/logic 101 loads a new frequency control word 102 into the input of the DAC 103, which generates a new analog frequency select voltage 104 ($V_{DAC}$) in response thereto. In some aspects, as shown in FIG. 2, the processor/logic 101 loads a new frequency select address 204 into a memory 201, which memory 202 loads a new frequency control word 102 into the DAC 103. With reference back to FIG. 1, the frequency control word 102 corresponds to a digital value to drive the DAC 103 to approximately the same value as the tuning voltage ($V_t$) applied to the VCO portion of the PLL 122 to set the output frequency 123 ($f_o$) to a specific desired output frequency 123 ($f_o$).

Figure 5:
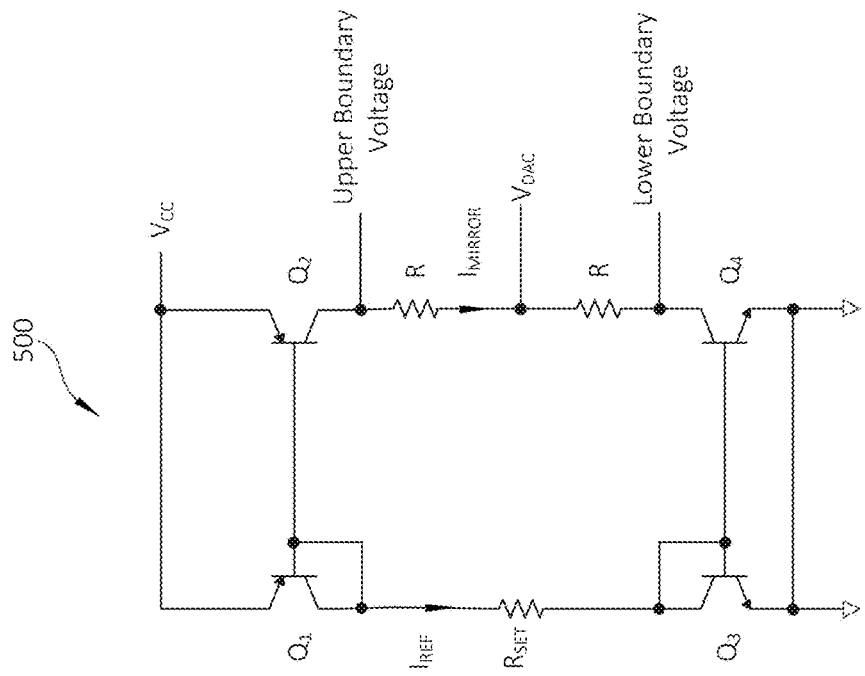
FIG. 5 is a schematic diagram of a voltage window generator according to one aspect of the present disclosure.
Figure 4:
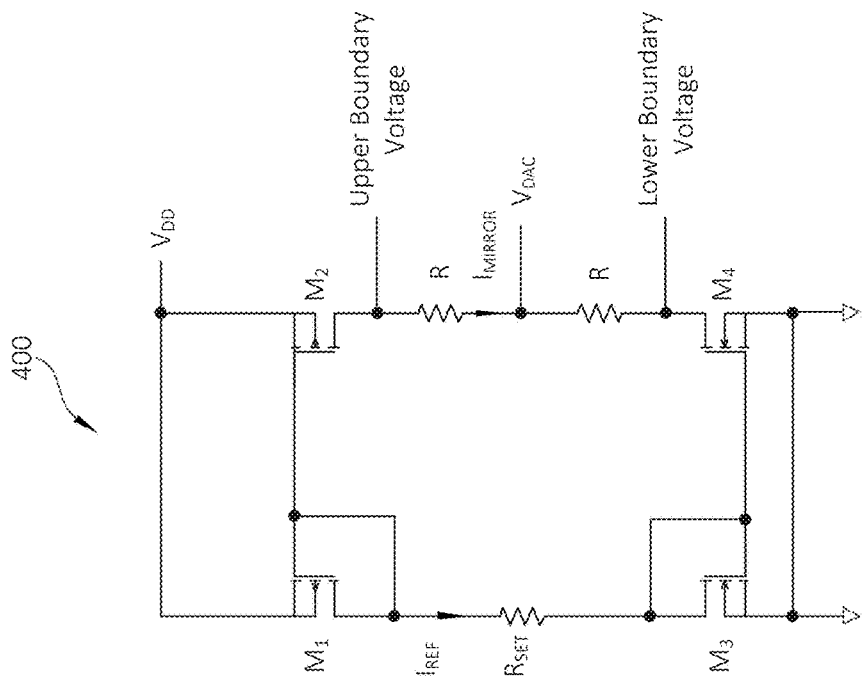
FIG. 4 is a schematic diagram of a voltage window generator according to one aspect of the present disclosure.

The output of the DAC 103 is coupled to a voltage window generator 105. The voltage window generator 105 receives the analog frequency select voltage 104 ($V_{DAC}$) and generates a first reference threshold voltage 106 and a second reference threshold voltage 108 based on the analog frequency select voltage 104 ($V_{DAC}$). A comparator voltage window is defined as the difference between the first and second reference threshold voltages 106, 108. The width of the comparator voltage window can be adjusted by changing a reference current, $I_{REF}$, in the voltage window generator 105. FIGS. 4 and 5 show examples of voltage window generators 400, 500 that may be employed in the indirect DAC-assisted frequency synthesizer 150.

Returning to FIG. 1, a window comparator 110 is coupled to the voltage window generator 105, the PLL 122, and a steering current circuit 118. The window comparator 110 receives the VCO tuning voltage 112 ($V_t$) from the PLL 122 and also receives the first and second reference threshold voltages 106, 108 from the voltage window generator 105. The window comparator 110 generates a first steering current control signal 114 and a second steering current control signal 116.

The steering current circuit 118 receives the first and second steering current control signals 114, 116 to control a steering current 120 coupled to the PLL 122 and to control the application of a phase comparator/detector signal 121, 128 to the input of the PLL 122 loop filter based on the state of the first and second steering current control signals 114, 116. The state of the first and second steering current control signals 114, 116 is determined based on the tuning voltage 112 ($V_t$) relative to the first and second reference threshold voltages 106, 108. When the tuning voltage 112 ($V_t$) rises above the first reference threshold voltage 106, the first steering current control signal 114 causes the steering current 120 to flow into (charge) the loop filter capacitor of the PLL 122. When the tuning voltage 112 ($V_t$) falls below the second reference threshold voltage 108, the second steering current control signal 116 causes the steering current 120 to flow out of (discharge) the loop filter capacitor of the PLL 122. When the tuning voltage 112 ($V_t$) remains between the first and second reference threshold voltages 106, 108, i.e., remains within the comparator window voltage, the first and second steering current control signals 114, 116 cause the phase comparator/detector signal 121, 128 to be applied to the input of the loop filter portion of the PLL 122.

The PLL 122 receives a reference oscillator signal 124 generated by a reference oscillator 126, which may be a crystal oscillator device. The PLL 122 also receives the same frequency control word 102 that is applied to the input of the DAC 103. The output frequency 123 ($f_o$) of the PLL 122 is a very stable frequency signal that has long term signal stability that is comparable to the reference oscillator 126. The PLL 122 compares the phase of the reference oscillator signal 124 and the output frequency 123 ($f_o$) and provides a phase comparator/detector signal 121 to the steering current circuit 118. The steering current circuit 118 includes logic to switch the phase comparator/detector signal 121 to the input of a loop filter portion of the PLL 122. The PLL 122 also provides a PLL lock detect output 130 to indicate the condition of the PLL 122. The PLL lock detect output 130 may be an analog or a digital lock detect. The analog and digital lock detect techniques employ the phase error at the phase comparator/detector inputs of the PLL 122 to decide whether the PLL 122 is in a locked condition. For example, when the phase error at the phase comparator/detector inputs on five or more consecutive cycles is inside a predetermined window (e.g., 15 ns), it considers the PLL 122 to be in lock and outputs a logic high. When the phase error drifts outside of the loss of lock threshold (e.g., 30 ns) on any subsequent phase comparator/detector cycle, it registers an out-of-lock condition, that is, a logic low. In some PLL circuits, the windows may be set by an external resistor.

FIG. 2 illustrates a signal generator 200 comprising a frequency synthesizer 150 according to one aspect of the present disclosure. The frequency synthesizer 200 comprises the indirect DAC-assisted frequency synthesizer 150 shown in FIG. 1 combined with a processor/logic 101 coupled to a memory 202. With reference now to FIGS. 1 and 2, to change the output frequency 123 ($f_o$), the processor/logic 101 receives a frequency selection circuit 132 and loads a frequency select address 204 to the memory 202 to load a new frequency control word 102 to the PLL 122 and to the DAC 103. The memory 202 stores digital values to drive the DAC 103 to approximately the same value as the tuning voltage applied to the VCO portion of the PLL 122 to generate a specific channel frequency. The memory 202 applies a digital word to the DAC 103, which converts the digital word to an analog frequency select voltage 104 ($V_{DAC}$) that is applied to the voltage window generator 105 as described in connection with FIG. 1. The memory 202 may be programmed with ambient temperature information stored in a digital thermometer "page" that may be used to calculate and mitigate the effects of temperature drift of the VCO portion of the PLL 122 and thus compensate for such temperature drift.

Figure 3:
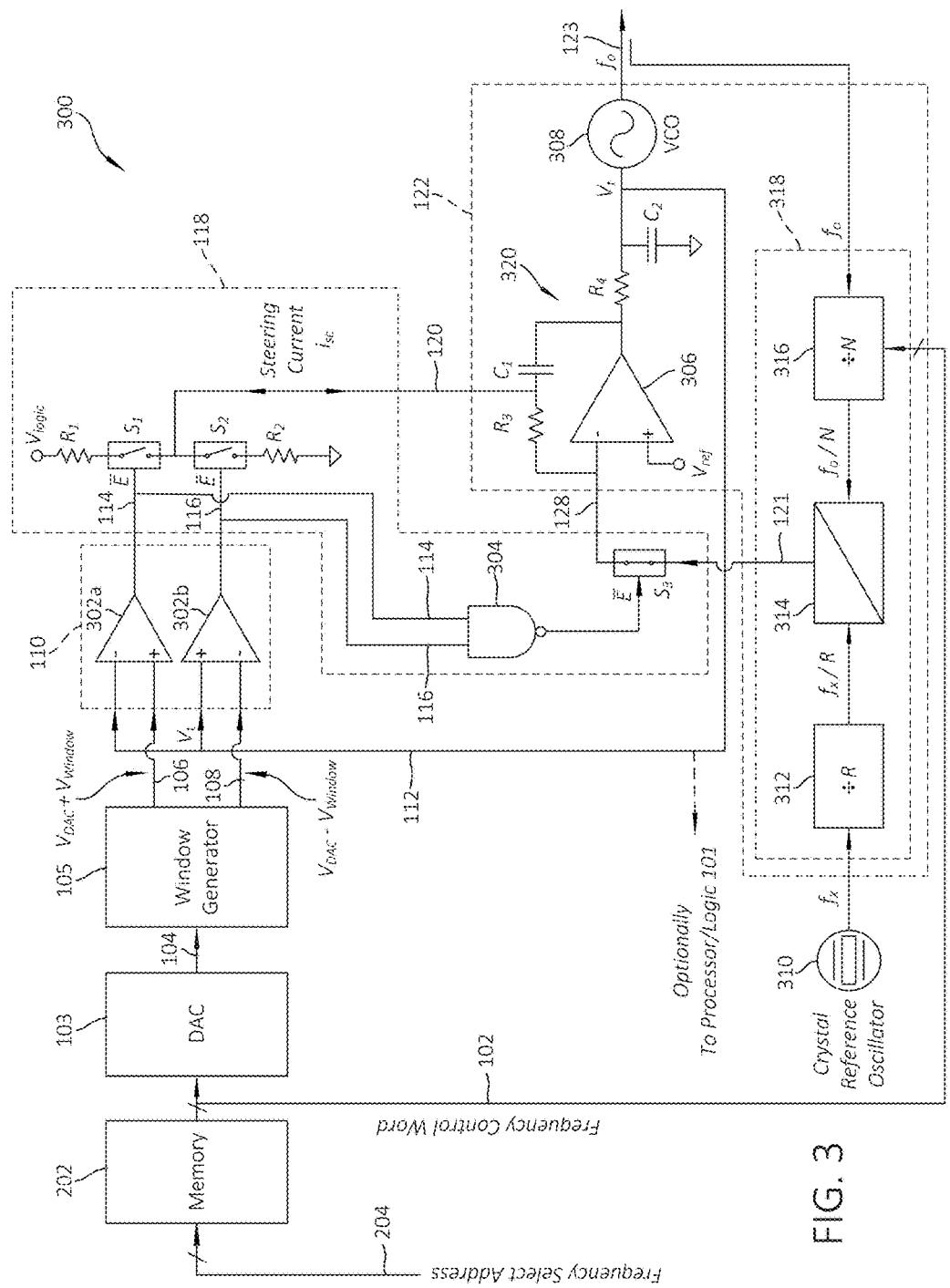
FIG. 3 illustrates a signal generator comprising a frequency synthesizer according to one aspect of the present disclosure.

FIG. 3 illustrates a signal generator 300 comprising a frequency synthesizer according to one aspect of the present disclosure. The signal generator 300 comprises an indirect DAC-assisted frequency synthesizer. The indirect DAC-assisted frequency synthesizer comprises a DAC 103 and the voltage window generator 105 as described in FIGS. 1 and 2 and the memory 202 as described in FIG. 2. For clarity of disclosure, the processor/logic 101 is not shown in FIG. 3. However, as discussed in connection with FIGS. 1 and 2, the processor/logic 101 monitors the lock detect output of the PLL 122 and the frequency selection circuit 132 to determine when to load a new frequency control word 102 to the DAC 102 and the programmable counter 316.

The voltage window generator 105 outputs the first reference threshold voltage 106 ($V_{DAC}+V_{Window}$) and the second reference threshold voltage 108 ($V_{DAC}-V_{window}$) to the window comparator 110. The window comparator 110 comprises an upper bound comparator 302a and a lower bound comparator 302b to compare the tuning voltage 112 ($V_t$) to the first and second reference threshold voltages 106, 108 (or upper and lower boundary voltages). The logic output 114 of the upper bound comparator 302a goes low (logic 0) when the tuning voltage 112 ($V_t$) rises above the first (upper boundary) reference threshold voltage 106 ($V_t > V_{DAC} V_{Window}$). The logic output 116 of the lower bound comparator 302b also goes low (logic 0) when the tuning voltage 112 ($V_t$) falls below the second (lower boundary) reference threshold voltage 108 ($V_t < V_{DAC}-V_{Window}$). The logic outputs 114, 116 of the respective comparators 302a, 302b remain high (logic 1) when the tuning voltage 112 ($V_t$) is between the first and second reference threshold voltages 106, 108 ($V_{DAC}-V_{Window} \leq V_t \leq V_{DAC}+V_{Window}$). The logic outputs 114, 116 of the respective comparators 302a, 302b become control inputs to the steering current circuit 118.

The PLL 122 comprises a PLL control circuit 318, a loop filter 320 (e.g., an active low pass filter), and a VCO 308. In one aspect, the VCO 308 may be implemented separately with an RFVC1843 5V InGaP MMIC VCO with an integrated frequency divider providing additional Fo/2 and Fo/4 outputs by RF Micro Devices (RFMD). The output frequency 123 ($f_o$) of the VCO 308 is the output of the signal generator 300 comprising an indirect DAC-assisted frequency synthesizer. A reference oscillator 310 may comprise a crystal reference oscillator that generates a reference frequency ($f_x$). The reference frequency ($f_x$) is applied to a fixed counter 312 (R divider circuit). A sample of the output frequency 123 ($f_o$) is applied to the programmable counter 316 (N divider circuit) via a directional coupler or signal splitter. The output of the programmable counter 316 is fed to a phase comparator/detector 314 together with the output of the fixed counter 312, which is a reference signal derived from the reference frequency ($f_x$) generated by the crystal reference oscillator 310. The value of the loop divisor (N) of the programmable counter 316 is controlled by the frequency control word 102. The phase comparator/detector 314 output signal 121 is fed to the input of the loop filter 320 via the switch S3, which is electronically activated when a control input is driven low (logic 0), as described hereinbelow.

The loop filter 320 comprises an operational amplifier 306 with a loop filter capacitor C1 inserted in the feedback loop. A resistor R3 may be provided between the loop filter capacitor C1 and the negative input of the amplifier 306. A passive low pass filter comprising R4 and C2 may be coupled between the output of the amplifier 306 and the VCO 308. The low pass filtered output of the loop filter 320 is the tuning voltage 112 ($V_t$), which is applied to the tuning port of the VCO 308 to produce the output frequency 123 ($f_o$). Provision is made to switch a steering current 120 ($I_{sc}$) into or out of the loop filter capacitor C1 via two high speed, low resistance analog switches S1, S2, as described hereinbelow, to increase the switching speed of the PLL 122.

The operation of the steering current circuit 118 is controlled by the logic outputs 114, 116 and are used as conditions for controlling the PLL 122. The steering current circuit 118 comprises two high speed, low resistance electronically activated analog switches S1, S2 that are activated when their control input is driven low (logic 0). Only one of the switches S1, S2 may be activated at a given time. For example, when the first logic output 114 is low (logic 0) the first switch S1 is activated (closed) and when the first logic output 114 is high (logic 1) the first switch S1 is deactivated (open). Similarly, when the second logic output 116 is low (logic 0) the second switch S2 is activated (closed) and when the second logic output 116 is high (logic 1) the second switch S2 is deactivated (open). A first resistor R1 is connected in series with the first switch S1 when the first switch S1 is activated to switch a steering current 120 into the loop filter capacitor C1 to charge the loop filter capacitor C1. A second resistor R2 is connected in series with the second switch S2 when the second switch S2 is activated to switch a steering current 120 out of the loop filter capacitor C1 to discharge the loop filter capacitor C1. The magnitude of the charging steering current 120 is set by R1 and the magnitude of the discharging steering current 120 is set by R2. In some aspects, the magnitude of the charging and discharging steering currents 120 may be the same or different depending on the values of the resistors R1 and R2. In one aspect, the analog switches S1 and S2 may be implemented with a 7SB384 Bus Switch advanced high-speed line switch in ultra-small footprint by ON Semiconductor.

A third high speed low resistance electronically activated analog switch S3 is provided to apply the phase comparator/detector signal 121 to the PLL 122 when activated by a logic 0. A NAND logic gate 304 receives the logic outputs 114, 116 from the window comparator 110 and outputs a logic 0 when both logic outputs 114, 116 are high (logic 1). A logic 0 output from the NAND gate 304 activates (closes) the third switch S3 to apply the phase comparator/detector signal 121 to the input of the lop filter 320. It will be appreciated that both logic outputs 114, 116 are high (logic 1) when the tuning voltage 112 ($V_t$) is between the first and second reference threshold voltages 106, 108. When both logic outputs 114, 116 are high (logic 1) both the first and second switches S1, S2 are deactivated (open) to decouple the steering current 120 from the loop filter capacitor C1 such that no steering current 120 flows into or out of the loop filter capacitor C1. The third switch S3, on the other hand, is activated (closed) to couple the phase comparator/detector signal 121 to the input of the loop filter 320.

TABLE 1 is a truth table summarizing the operation of the window comparator 110 and the steering current circuit 118.

TABLE 1

| Upper Bound Comparator 302a Output | Lower Bound Comparator 302b Output | NAND Gate 304 Output | Description |
| --- | --- | --- | --- |
| 0 | 1 | 1 | Tuning voltage 112 ($V_t$) risess above the first reference threshold voltage 106 ($V_t > V_{DAC} + V_{Window}$); S1 closed; S2 and S3 open; steering current 120 charges the loop filter capacitor C1 |

TABLE 1-continued

| Upper Bound Comparator 302a Output | Lower Bound Comparator 302b Output | NAND Gate 304 Output | Description |
|---|---|---|---|
| 1 | 0 | 1 | Tuning voltage 112 ($V_t$) falls below the second reference threshold voltage 108 ($V_t < V_{DAC} - V_{Window}$); S2 closed; S1 and S3 open; steering current 120 discharges the loop filter capacitor C1 |
| 1 | 1 | 0 | Tuning voltage 112 ($V_t$) remains between the first and second reference threshold voltages 106, 108 ($V_{DAC} - V_{Window} \le V_t \le V_{DAC} + V_{Window}$); S1 and S2 open; S3 closed; no steering current 120 flows; phase comparator/detector signal 121 coupled to the PLL 122 |

Under steady state conditions the PLL 122 will be locked and the output frequency 123 ($f_o$) is expressed as:

$$f_o = N \times \frac{f_x}{R} \qquad \text{Eq. 1}$$

where N is the divisor of the programmable counter 316, as controlled by the frequency control word 102, and R is the divisor of the fixed counter 312. The tuning voltage 112 ($V_t$) will be close to the analog frequency select voltage 104 ($V_{DAC}$) existing on the output port of the DAC 103 and will be between the first and second reference threshold voltages 106, 108 (e.g., inside the comparator window voltage). The comparator output logic levels will both be high (logic 1); the phase comparator/detector 334 series switch S3 will be closed since the output of the NAND gate 304 will be low (logic 0).

When the processor/logic 101 receives a new frequency selection from the frequency selection circuit 132, the following process is performed to change the output frequency 123 ($f_o$) to a new selected output frequency 123 ($f_o'$):

1. A new frequency select address is loaded into the memory 202 by the processor/logic 101 and a new frequency control word 102 is loaded into the DAC 103 and the programmable counter 316 of the PLL 122 (divide by N).
2. The analog frequency select voltage 104 ($V_{DAC}$) output of the DAC 103 will switch to a value corresponding to a tuning voltage 112 ($V_t$) required to tune the VCO 308 to the new selected output frequency 123 ($f_o$).
3. The tuning voltage 112 ($V_t$) will now rise above or fall below the DAC window voltage boundaries defined by the first and second reference threshold voltages 106, 108 depending on whether the new selected output frequency 123 ($f_o'$) is greater than or less than the previous output frequency 123 ($f_o$).
4. The third analog switch S3 in series with the phase comparator/detector 314 will open and effectively converts the loop filter 320 into an "operational integrator" circuit.
5. The appropriate steering current analog switch S1 or S2 will close. The first analog switch S1 will close if the tuning voltage 112 ($V_t$) is above the upper DAC window voltage boundary defined by the first reference threshold voltage 106. The second analog switch S2 will close if the tuning voltage ($V_t$) is below the lower DAC window voltage boundary defined by the second reference threshold voltage 108.
6. The loop filter capacitor C1 will charge or discharge in a linear fashion and the instantaneous loop filter 320 output voltage, e.g., the tuning voltage 112 ($V_t$), will be given by the following equations based on a 5.0 V supply:

$$V_t = V_{t(initial)} \pm \left[ \frac{(V_{logic} - V_{ref})}{R_1 \text{ or } R_2} \times \frac{1}{C_1} \right] \times T \qquad \text{Eq. 2}$$

$$\frac{dV_t}{dt} = \frac{2.5}{R_1 \text{ or } R_2} \times \frac{1}{C_1} \times \frac{\text{volts}}{\text{seconds}} \qquad \text{Eq. 3}$$

7. When the tuning voltage 112 ($V_t$) enters the DAC voltage "window," the first and second analog switches S1 and S2 will open and the third analog switch S3 will close.
8. The PLL 122 will now lock to the new selected output frequency ($f_o'$) and the PLL "lock detect" 130 will be asserted.

FIG. 4 is a schematic diagram of a voltage window generator 400 according to one aspect of the present disclosure. The voltage window generator 400 comprises a pair of MOSFET current mirrors, where a first MOSFET current mirror is defined by P-channel MOSFET transistors $M_1$ and $M_2$ and a second MOSFET current mirror is defined by N-channel MOSFET transistors $M_3$ and $M_4$. The mirror current $I_{MIRROR}$ is equal to the reference current $I_{REF}$ established by the pair of MOSFET current mirrors. The voltage window generator 400 produces two voltages equispaced above and below the DAC 103 output voltage $V_{DAC}$ each of which takes the DAC voltage in the same sense. The window opening (the difference between the upper and lower boundary voltages) may be adjusted by setting the reference current $I_{REF}$ flowing through the two MOSFET current mirrors. Assuming matched P-channel and N-channel MOSFET devices, the mirror current $I_{MIRROR}$ is given by:

$$I_{MIRROR} = I_{REF} \approx V_{DD} - \frac{2V_{THRESHOLD}}{R_{SET}} \qquad \text{Eq. 4}$$

The Upper Boundary Voltage is given by:

$$\text{Upper Boundary Voltage} = V_{DAC} + I_{MIRROR} \times R \qquad \text{Eq. 5}$$

The Lower Boundary Voltage is given by:

$$\text{Lower Boundary Voltage} = V_{DAC} - I_{MIRROR} \times R \qquad \text{Eq. 6}$$

FIG. 5 is a schematic diagram of a voltage window generator 500 according to one aspect of the present disclosure. The voltage window generator 500 comprises a pair of BJT current mirrors, where a first BJT current mirror is defined by PNP transistors $Q_1$ and $Q_2$ and a second BJT current mirror is defined by NPN transistors $Q_3$ and $Q_4$. The mirror current $I_{MIRROR}$ is equal to the reference current $I_{REF}$ established by the pair of BJT current mirrors. The voltage window generator 500 produces two voltages equispaced above and below the DAC 103 output voltage $V_{DAC}$ each of which takes the DAC voltage in the same sense. The window opening (the difference between the upper and lower boundary voltages) may be adjusted by setting the reference current $I_{REF}$ flowing through the two BJT current mirrors. Assuming matched PNP and NPN devices, the mirror current $I_{MIRROR}$ is given by:

$$I_{MIRROR} = I_{REF} \approx \frac{V_{CC} - 1.4}{R_{SET}} \qquad \text{Eq. 7}$$

The Upper Boundary Voltage is given by:

Upper Boundary Voltage=$V_{DAC}+I_{MIRROR} \times R$ Eq. 8

The Lower Boundary Voltage is given by:

Lower Boundary Voltage=$V_{DAC}-I_{MIRROR} \times R$ Eq. 9

Figure 6:
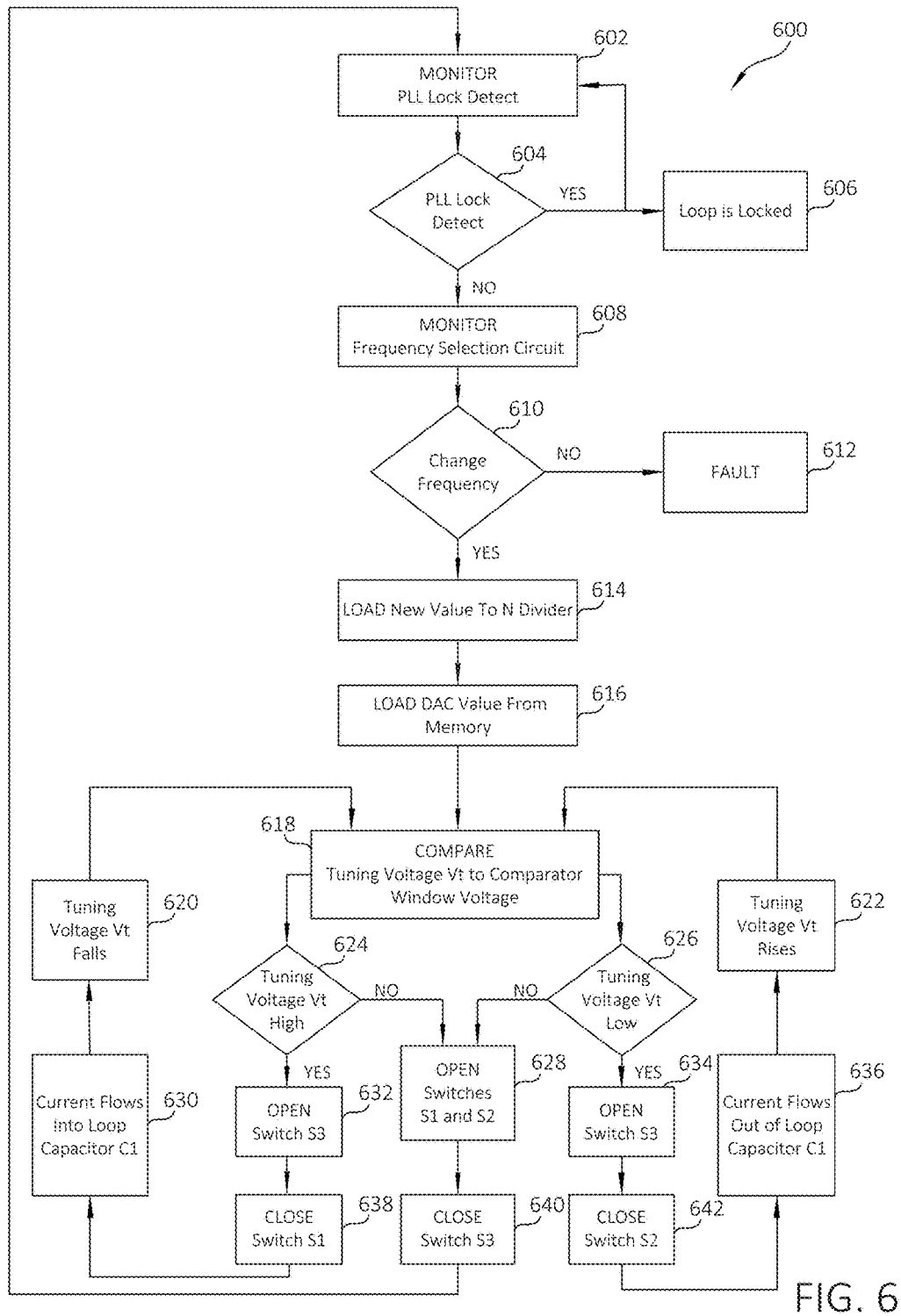
FIG. 6 is a logic flow diagram for operating the signal generator comprising a frequency synthesizer described in FIGS. 1-3 according to one aspect of the present disclosure.

FIG. 6 is a logic flow diagram 600 for operating the signal generator comprising a frequency synthesizer described in FIGS. 1-3 according to one aspect of the present disclosure. The logic flow diagram 600 will be described in combination with the hardware circuits described in FIGS. 1-3. Accordingly, with reference now to FIGS. 1-3 and 6, the processor/logic 101 monitors 602 the PLL lock detect output 130 of the PLL 122 to determine 604 whether the PLL 122 is in the locked condition and if true registers 606 the PLL 122 locked condition. The processor/logic 101 also monitors 608 the frequency selection circuit 132 to determine 610 whether to change the current output frequency 123 ($f_o$) to a new output selected frequency 123 ($f_o'$). If the PLL 122 is unlocked and there is no change in selected frequency indicated by the frequency selection circuit 132, the processor/logic 101 registers 612 a fault. On the other hand, if the processor/logic 101 determines 610 a change in output frequency 123 ($f_o$) from the frequency selection circuit 132, the processor/logic 101 continues along the YES branch, loads 614 a new frequency control word 102 from the memory 202 into the programmable counter 316, and loads 616 the new frequency control word 102 from the memory 202 into the DAC 103 input.

To change the output frequency 123 ($f_o$) to the new specified output frequency 123 ($f_o'$), the processor/logic 101 loads a new frequency select address 204 into the memory 202, which loads the new frequency control word 102 into the DAC 103 and the programmable counter 316. The new frequency control word 102 corresponds to the new specified output frequency 123 ($f_o'$). The new frequency control word 102 applied to the programmable counter 316 starts to change the tuning voltage 112 ($V_t$). However, at the same time, the DAC 103 applies a new analog frequency select voltage 104 ($V_{DAC}$) to the voltage window generator 105 to generate new first and second reference threshold voltages 106, 108 defining a new DAC window voltage boundary. The current tuning voltage 112 ($V_t$) is now compared 618 to the new first and second reference threshold voltages 106, 108 and causes a change in the first and second steering current control signals 114, 116.

Accordingly, once the new frequency control word 102 is loaded 616 into the DAC 103, the comparator circuit 110 compares 618 the current tuning voltage 112 ($V_t$) to a new DAC window voltage boundary. The current tuning voltage 112 ($V_t$) will now be either above or below the DAC window voltage boundaries defined by the first and second reference threshold voltages 106, 108 depending on whether the current specified output frequency 123 ($f_o'$) is greater than or less than the prior output frequency 123 ($f_o$).

If the comparator circuit 110 determines 624 that the tuning voltage 112 ($V_t$) is high (above the upper boundary voltage), the comparator circuit 110 sets the first and second steering current control signals 114, 116 to open 632 the third switch S3 and close 638 the first switch S1, while the second switch S2 remains open. This causes the steering current 120 to flow 630 into the loop filter capacitor C1 (charges) and causes the tuning voltage 112 ($V_t$) to decrease 620. The comparator circuit 110 continuously compares 618 the new tuning voltage 112 ($V_t$) to the upper voltage boundary causing the steering current 120 to continuously flow 630 into the loop filter capacitor C1 (charges) until the tuning voltage 112 ($V_t$) decreases 620 to a value within the DAC window voltage boundary (neither above the upper boundary voltage nor below the lower boundary voltage). Accordingly, the PLL 122 rapidly switches from the current output frequency ($f_o$) to the new specified output frequency ($f_o'$) while simultaneously minimizing loop bandwidth and lowering phase noise and phase jitter.

If the comparator circuit 110 determines 626 that the tuning voltage 112 ($V_t$) is low (below the lower boundary voltage), the comparator circuit 110 sets the first and second steering current control signals 114, 116 to open 634 the third switch S3 and close 642 the second switch S2, while the first switch S1 remains open. This causes the steering current 120 to flow 636 out of 636 the loop filter capacitor C1 and causes the tuning voltage 112 ($V_t$) to increase 622. The comparator circuit 110 continuously compares 618 the new tuning voltage 112 ($V_t$) to the lower voltage boundary causing the steering current 120 to continuously flow 636 out of the loop filter capacitor C1 (discharges) until the tuning voltage 112 ($V_t$) increases 622 to a value within the DAC window voltage boundary (neither above the upper boundary voltage nor below the lower boundary voltage). Accordingly, the PLL 122 rapidly switches from the current output frequency ($f_o$) to the new specified output frequency ($f_o'$) while simultaneously minimizing loop bandwidth and lowering phase noise and phase jitter.

If the comparator circuit 110 simultaneously determines that the tuning voltage 112 ($V_t$) is within the DAC window voltage boundary (neither above the upper boundary voltage nor below the lower boundary voltage), the process continues along the NO branches. The comparator circuit 110 sets the first and second steering current control signals 114, 116 to open 628 the first and second switches S1, S2 and to close the third switch S3. This applies the phase comparator/detector signal 121 to the input of the loop filter 320. The processor/logic 101 continues to monitor 602 the PLL 122 lock detect output 130 and to monitor 608 the frequency selection circuit 132 until a change output frequency command is received the processor/logic 101.

One aspect the signal generator 300 comprising a frequency synthesizer described in connection FIG. 3 was implemented and tested using a Texas Instruments LMX2492 Evaluation PCB fitted with a RFMD RFVC 1843 VCO. The PLL loop bandwidth was set at approximately 100 kHz for an output frequency of 11.0 GHz. The VCO tuning sensitivity is 150 MHz/volt and the phase/frequency charge pump current was set at 3.1 milliamps. The loop phase margin was set at 60 degrees. The loop filter 320 calculations predict a value for the loop filter capacitor C1=0.047 microfarads.

Figure 7:
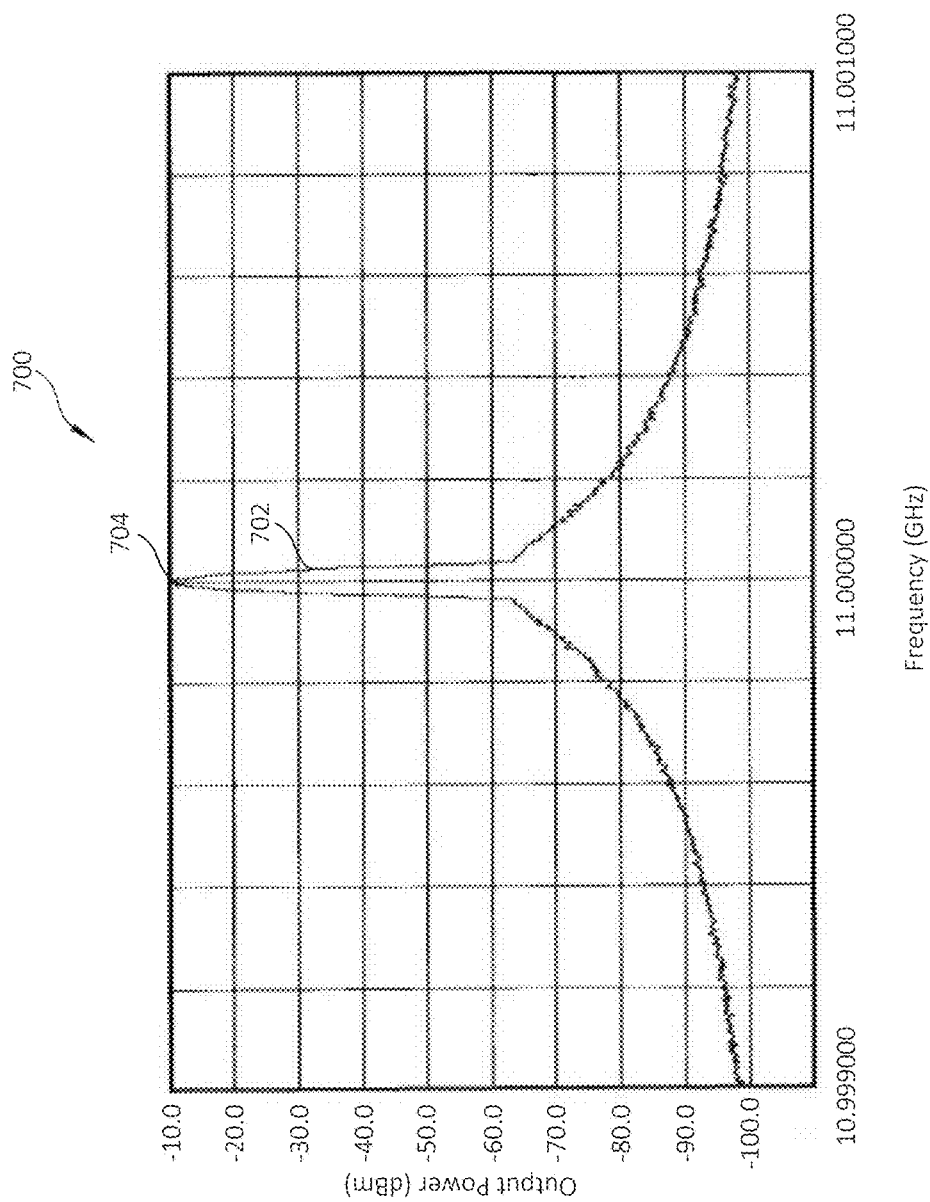
FIG. 7 is a graphical illustration of an output spectrum plot of an indirect digital synthesizer circuit in a locked condition over a span of 2.0 MHz according to one aspect of the present disclosure.

FIG. 7 is a graphical illustration 700 of an output spectrum plot 702 of the signal generator 100, 200, 300 in a locked condition over a span of 2.0 MHz. The horizontal axis is Frequency (GHz) and the vertical axis is Power Output (dBm). The output spectrum plot 702 shows a power output 704 at 11.0 GHz of about −10 dBm (−9.806 as measured).

Figure 8:
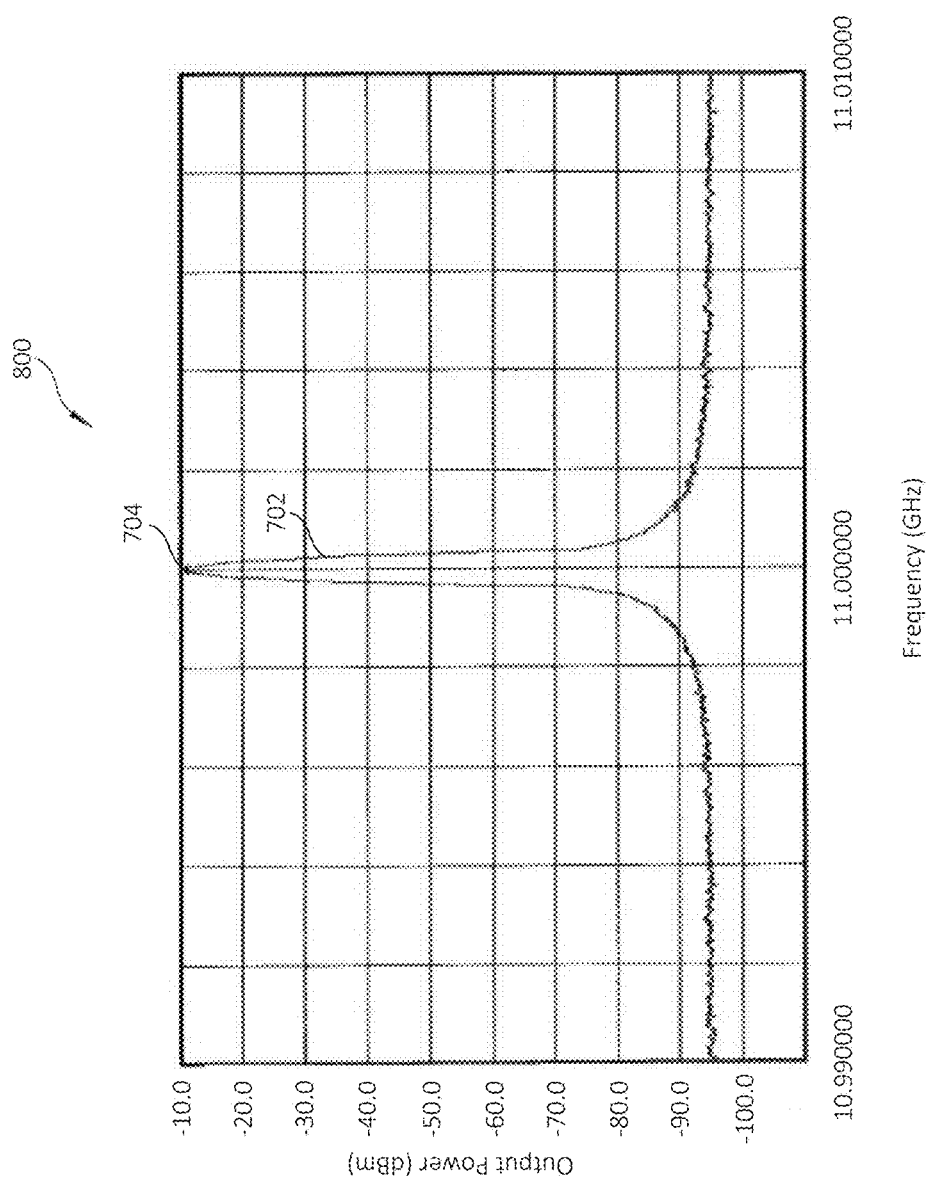
FIG. 8 is a graphical illustration of the output spectrum plot of an indirect digital synthesizer circuit in a locked condition over a span is 20.0 MHz according to one aspect of the present disclosure.

FIG. 8 is a graphical illustration 800 of the output spectrum plot 702 of the signal generator 100, 200, 300 in a locked condition over a span is 20.0 MHz. The horizontal axis is Frequency (GHz) and the vertical axis is Power Output (dBm). The output spectrum plot 702 shows a power output 704 at 11.0 GHz of about −10 dBm (−9.777 dBm as measured). The output spectra 702 are very pure with no evidence of noise being injected from the indirect DAC steering mechanism.

Figure 9:
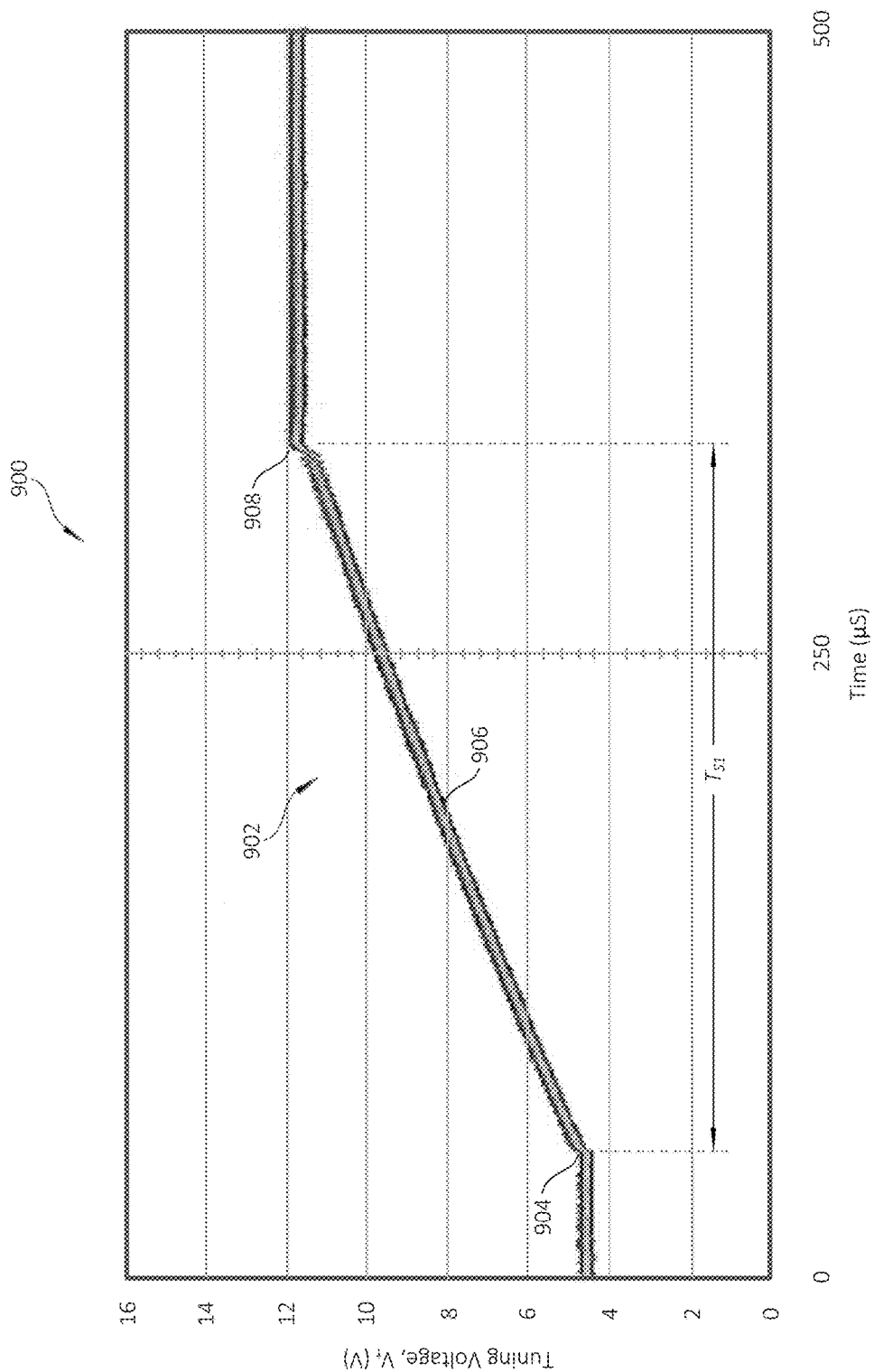
FIG. 9 is a graphical illustration of a PLL circuit switching from approximately 10.0 GHz to 11.0 GHz phase-locked and accurate with no steering current injection.

FIG. 9 is a graphical illustration 900 of a PLL circuit switching from approximately 10.0 GHz to 11.0 GHz phase-locked and accurate with no steering current injection. The horizontal axis is Time (μS) and the vertical axis is Tuning Voltage Vt (V). The graph 900 shows a plot 902 of VCO tuning voltage versus time as the VCO switches from 10.0 GHz to 11.0 GHz. As shown, the VCO tuning voltage $V_t$ for the VCO at a free running condition of 10.0 GHz is about 4.5 V. At a first inflection point 904 the tuning voltage begins to ramp up. The tuning voltage ramps 906 up to about 12 V until the VCO output frequency reaches 11.0 GHz at a second inflection point 908 switching from a free running condition at 10.0 GHz to a locked condition at 11.0 GHz with the indirect DAC steering system disabled. As illustrated, the PLL circuit with the indirect DAC steering system disabled takes approximately the switching period $T_{S1}$=290 microseconds to acquire phase lock. The slew rate, defined as the change in tuning voltage $V_t$ over time, is $$\approx \frac{7.5 \text{ V}}{7 \text{ }\mu S} \approx 1.07 \frac{\text{V}}{\mu S}.$$

Figure 10:
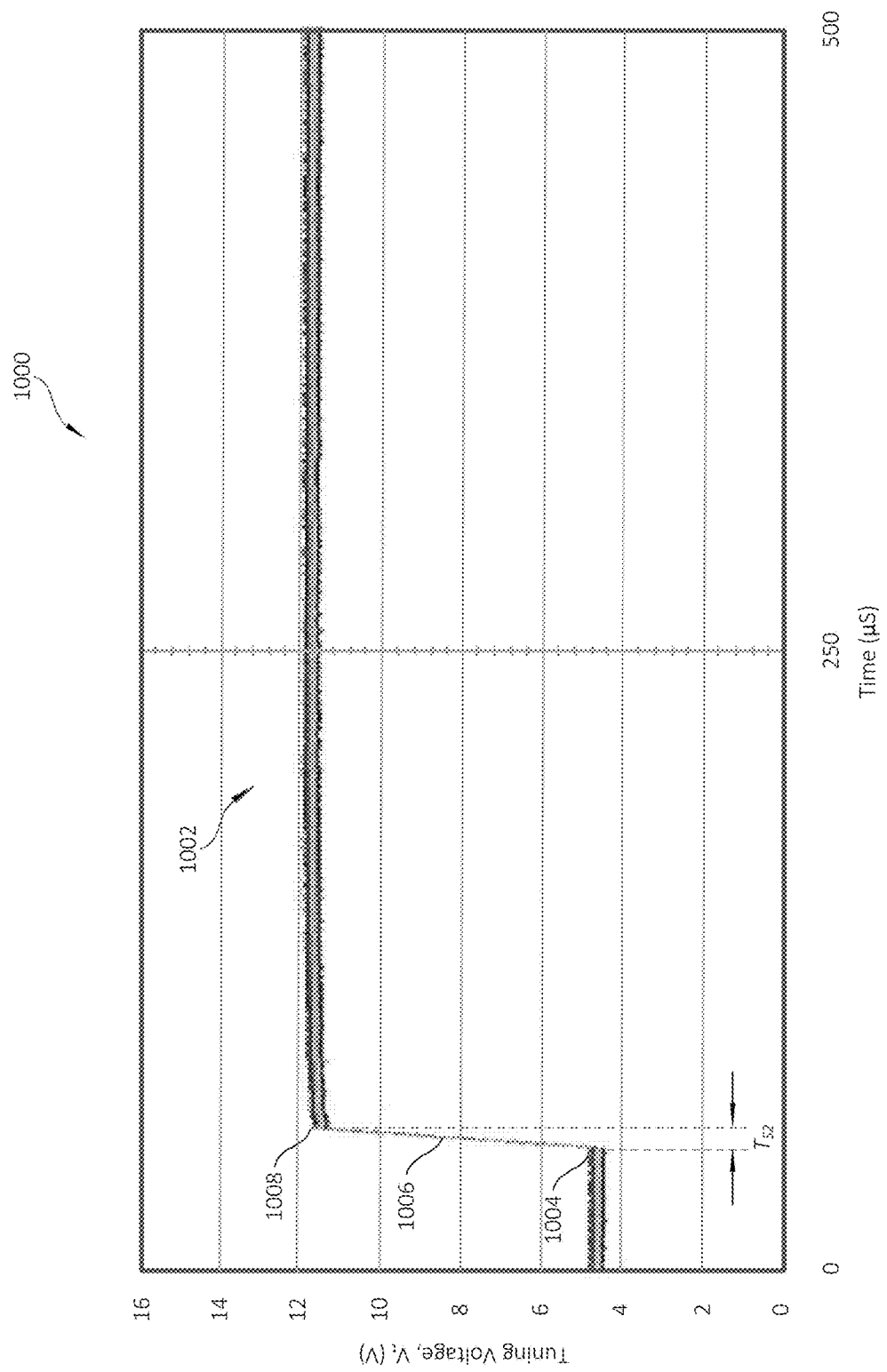
FIG. 10 is a graphical illustration of the signal generator comprising an indirect digital PLL synthesizer shown in FIGS. 1-3 switching from approximately 10.0 GHz to 11.0 GHz phase-locked and accurate with a steering current injection of about 50 mA.

FIG. 10 is a graphical illustration 1000 of the PLL 122 shown in FIGS. 1-3 switching from approximately 10.0 GHz to 11.0 GHz phase-locked and accurate with a steering current 120 injection of about 50 mA. The horizontal axis is Time (μS) and the vertical axis is Tuning Voltage Vt (V). The graph 1000 shows a plot 1002 of the VCO 308 tuning voltage 112 ($V_t$) versus time as the VCO 308 switches from 10.0 GHz to 11.0 GHz. As shown, the VCO tuning voltage 112 ($V_t$) for the VCO 308 at a free running condition of 10.0 GHz is about 4.5 V. At a first inflection point 1004 the tuning voltage 112 ($V_t$) begins to ramp up. The tuning voltage 112 ramps 1006 up to about 12 V until the VCO 308 output frequency reaches 11.0 GHz at a second inflection point 1008 switching from a free running condition at 10.0 GHz to a locked condition at 11.0 GHz with a steering current 120 injection of about 50 mA. As illustrated, the PLL 122 with a steering current 120 injection of about 50 mA takes approximately the switching period $T_{S2}$=7 microseconds to acquire phase lock. This represents a switching speed improvement of more than 40 times. The slew rate, defined as the change in tuning voltage $V_t$ over time, is $$\approx \frac{7.5 \text{ V}}{290 \text{ }\mu S} \approx 0.026 \frac{\text{V}}{\mu S}.$$

Figure 11:
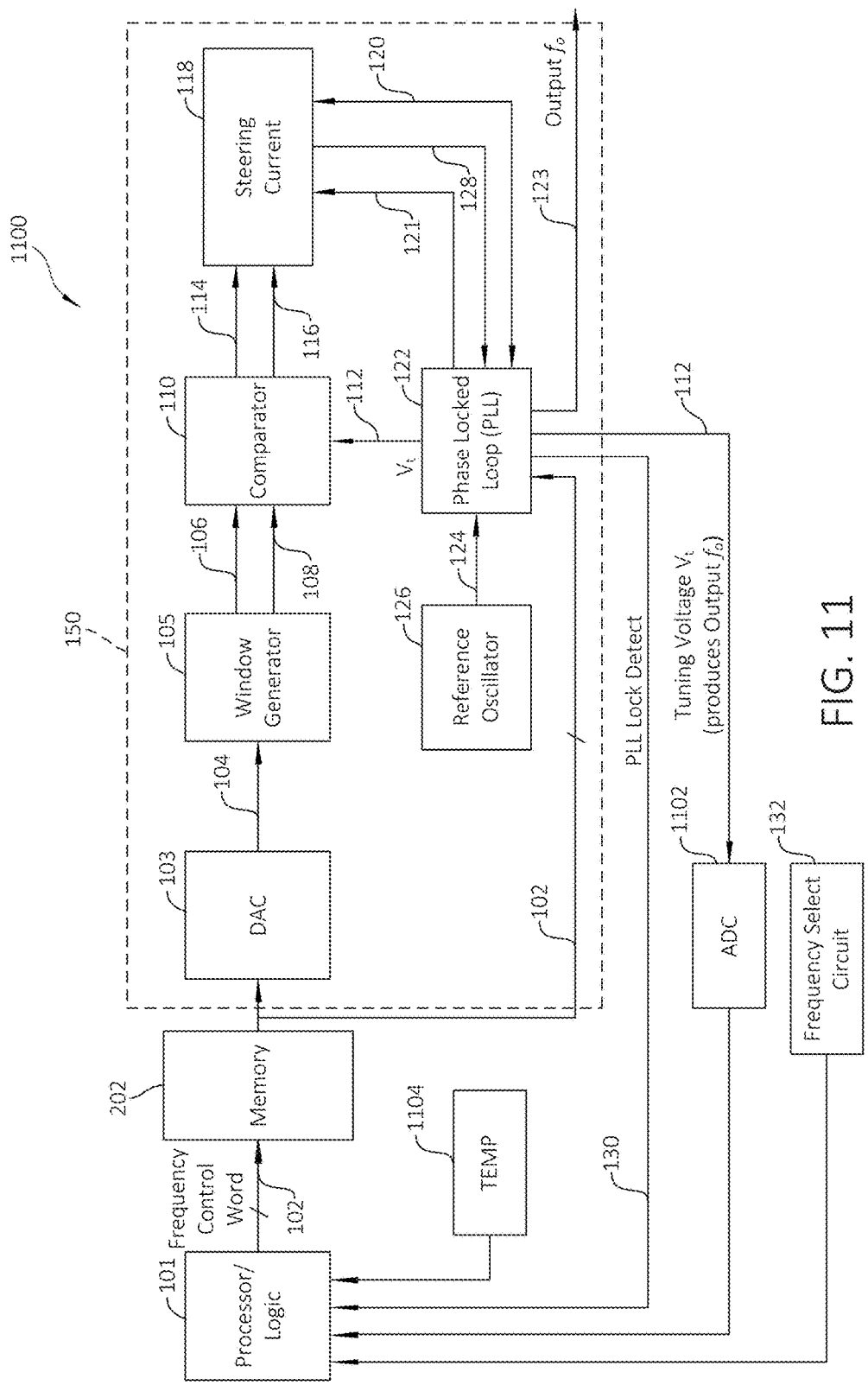
FIG. 11 illustrates a signal generator comprising a frequency synthesizer with tuning voltage monitoring function according to one aspect of the present disclosure.

FIG. 11 illustrates a signal generator 1100 comprising a frequency synthesizer with tuning voltage monitoring function according to one aspect of the present disclosure. The signal generator 1100 is substantially equivalent to the signal generator 100, 200, 300 shown in FIGS. 1-3 with the addition of an ADC 1102 coupled between the PLL 122 and the processor/logic 101 and an ambient temperature sensor 1104 coupled to the processor/logic 101. In one aspect, the ADC 1102 receives the tuning voltage 112 ($V_t$) in analog form and converts it into digital form for the processor/logic 101 to read. This enables the processor/logic 101 to conduct calibration of the tuning voltage 112 ($V_t$) versus frequency and/or ambient temperature as measured by the temperature sensor 1104. The processor/logic 101 can read the tuning voltage 112 ($V_t$) and/or ambient temperature and continuously update the memory 202. The memory 202 may be programmed with ambient temperature information stored in a digital thermometer "page" that may be used to calculate and mitigate the effects of temperature drift of the VCO portion of the PLL 122 and thus compensate for such temperature drift. The ADC 1102 may be a high speed ADC and also may be integrated with the PLL 122. A voltage divider circuit or amplifier circuit may be located ahead of the ADC 1102 to produce a tuning voltage 112 ($V_t$) in a range that is compatible with the specifications of the ADC 1102.

As used throughout this disclosure and in particular with reference to FIGS. 1-3 and 6, the processor/logic 101 may comprise one or more processor circuits or processing units, one or more memory circuits and/or storage circuit component(s) and one or more input/output (I/O) circuit devices. Additionally, the processor/logic 101 comprises a bus that allows the various circuit components and devices to communicate with one another. The bus represents one or more of any of several types of bus structures, including a memory bus or memory controller using any of a variety of bus architectures. The bus may comprise wired and/or wireless buses.

The processor/logic 101 may be responsible for executing various software programs such as system programs, applications programs, and/or modules to provide computing and processing operations. The processor/logic 101 may be responsible for performing various data communications operations transmitting and receiving data information over one or more wired or wireless communications channels. The processor/logic 101 may include any suitable processor architecture and/or any suitable number of processors in accordance with this disclosure. In one aspect, the processor/logic 101 may be implemented using a single integrated processor.

The processor/logic 101 may be implemented as a host central processing unit (CPU) using any suitable processor circuit or logic device (circuit), such as a as a general purpose processor and/or a state machine. The processor/logic 101 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

In various aspects, the processor/logic 101 may be implemented as a microcontroller comprising one or more processors (e.g., microprocessor, microcontroller) coupled to at least one memory 202. The memory 202 stores machine executable instructions that when executed by the processor/logic 101, cause the processor/logic 101 to execute machine instructions to implement various processes described herein. The processor/logic 101 may be any one of a number of single or multi-core processors known in the art. The memory 202 may comprise volatile and non-volatile storage media. The processor/logic 101 may include an instruction processing unit and an arithmetic unit. The instruction processing unit may be configured to receive instructions from the memory 202 of this disclosure.

The processor/logic 101 may be implemented using combinational logic circuits. The combinational logic circuits can be configured to implement various processes described herein. The processor/logic 101 may comprise a finite state machine comprising a combinational logic circuit configured to receive data, process the data, and provide an output of the signal generator 100, 200, 300.

The processor/logic 101 may comprise a sequential logic circuit configured to control aspects of the signal generator 100, 200, 300. The sequential logic circuit or the combinational logic circuit can be configured to implement various processes described herein. The sequential logic circuit may comprise a finite state machine. The sequential logic circuit may comprise a combinational logic circuit, at least one memory circuit, and a clock, for example. The at least one memory circuit can store a current state of the finite state machine. In certain instances, the sequential logic circuit may be synchronous or asynchronous. The combinational logic circuit is configured to receive data associated with the surgical instrument or tool from an input, process the data, and provide an output of the signal generator 100, 200, 300. In other aspects, the circuit may comprise a combination of a processor and a finite state machine to implement various processes herein. In other aspects, the finite state machine may comprise a combination of a combinational logic circuit and a sequential logic circuit.

As shown, the processor/logic 101 may be coupled to the memory 202 and/or storage component(s) through a memory bus. The memory bus may comprise any suitable interface and/or bus architecture for allowing the processor/logic 101 to access the memory 202 and/or storage component(s). Although the memory 202 and/or storage component(s) may be shown as being separate from the processor/logic 101 for purposes of illustration, it is worthy to note that in various aspects some portion or the entire memory 202 and/or storage component(s) may be included on the same integrated circuit as the processor/logic 101. Alternatively, some portion or the entire memory 202 and/or storage component(s) may be disposed on an integrated circuit or other medium (e.g., hard disk drive) external to the integrated circuit of the processor/logic 101.

The memory 202 and/or storage component(s) represent one or more computer-readable media. The memory 202 and/or storage component(s) may be implemented using any computer-readable media capable of storing data such as volatile or non-volatile memory, removable or non-removable memory, erasable or non-erasable memory, writeable or re-writeable memory, and so forth. The memory 202 and/or storage component(s) may comprise volatile media (e.g., random access memory (RAM)) and/or nonvolatile media (e.g., read only memory (ROM), Flash memory, optical disks, magnetic disks and the like). The memory 202 and/or storage component(s) may comprise fixed media (e.g., RAM, ROM, a fixed hard drive, etc.) as well as removable media (e.g., a Flash memory drive, a removable hard drive, an optical disk, etc.). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

While various details have been set forth in the foregoing description, it will be appreciated that the various aspects of the techniques for operating a frequency synthesizer may be practiced without these specific details. One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Further, while several forms have been illustrated and described, it is not the intention of the applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

For conciseness and clarity of disclosure, selected aspects of the foregoing disclosure have been shown in block diagram form rather than in detail. Some portions of the detailed descriptions provided herein may be presented in terms of instructions that operate on data that is stored in one or more computer memories or one or more data storage devices. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

Unless specifically stated otherwise as apparent from the foregoing disclosure, it is appreciated that, throughout the foregoing disclosure, discussions using terms such as "processing" or "computing" or "calculating" or "determining" or "displaying" or the like, refer to the action and processes of a computer system, or similar electronic computing device, that manipulates and transforms data represented as physical (electronic) quantities within the processor system's registers and memories into other data similarly represented as physical quantities within the processor system memories or registers or other such information storage, transmission or display devices.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose processing device configured by an executable computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. In one form, several portions of the subject matter described herein may be implemented via an application specific integrated circuit (ASIC), a field programmable gate array (FPGA), a digital signal processor (DSP), or other integrated formats. However, those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In some instances, one or more elements may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other and yet still co-operate or interact with each other. It is to be understood that depicted architectures of different components contained within, or connected with, different other components are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated also can be viewed as being "operably connected," or "operably coupled," to each other to achieve the desired functionality, and any two components capable of being so associated also can be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components, and/or electrically interacting components, and/or electrically interactable components, and/or optically interacting components, and/or optically interactable components.

In other instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present disclosure have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "one form," or "a form" means that a particular feature, structure, or characteristic described in connection with the aspect is included in at least one aspect. Thus, appearances of the phrases "in one aspect," "in an aspect," "in one form," or "in a form" in various places throughout the specification are not necessarily all referring to the same aspect. Furthermore, the particular features, structures or characteristics may be combined in any suitable manner in one or more aspects.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The following references are incorporated herein by reference: Phase Locked Loops Principles and Practice, Paul V. Brennan, McGraw Hill 1996; U.S. Pat. No. 3,755,758 to D. Leeson; Frequency Synthesis, Jerzy Gorski-Popiel, John Wiley & Sons 1975; Frequency Synthesizers Theory and Design, Vadim Manassewitsch, John Wiley & Sons 1980; Phaselock Techniques, Floyd Gardner, John Wiley & Sons 1966; Operational Amplifiers, G. Clayton & S. Winder Newnes 2000; YIG Resonators and Filters, J. Helszian, John Wiley & Sons 1985. All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

Various aspects of the subject matter described herein are set out in the following numbered examples:

Example 1

A signal generator, comprising: a voltage window generator to receive an analog frequency select signal from a digital-to-analog converter (DAC) and to generate a first reference threshold voltage and a second reference threshold voltage based on the analog frequency select signal; a window comparator coupled to the voltage window generator, the window comparator to receive a voltage controlled oscillator (VCO) tuning voltage from a phase locked loop (PLL), receive the first and second reference threshold voltages from the voltage window generator, and generate a first steering current control signal and a second steering current control signal; and a steering current circuit coupled to the window comparator, the steering current circuit to receive the first and second steering current control signals to control a steering current coupled to a PLL and apply a phase comparator/detector signal to an PLL based on the first and second steering current control signals.

Example 2

The signal generator of Example 1, further comprising: a memory coupled to the DAC, the memory to store the digital frequency control word; and a DAC coupled to the memory and the voltage window generator, the DAC circuit to receive a digital frequency control word and generate the analog frequency select signal.

Example 3

The signal generator of any one of Examples 1-2, wherein the voltage window generator comprises: a first current mirror to generate the first reference threshold voltage; a second current mirror to generate the second reference threshold voltage; and a resistor coupled in series between the first and second current mirrors.

Example 4

The signal generator of Example 3, wherein: the first current mirror comprises a pair of PNP bi-polar junction (BJT) transistors; and the second current mirror comprises a pair of NPN bi-polar junction transistors.

Example 5

The signal generator of Example 3, wherein: the first current mirror comprises a pair of P-channel MOS metal-oxide-silicon (MOS) transistors; and the second current mirror comprises a pair of N-channel MOS transistors.

Example 6

The signal generator of any one of Examples 1-5, wherein the window comparator comprises: an upper bound comparator; and a lower bound comparator; wherein the upper bound comparator is configured to receive the first threshold voltage from the voltage window generator and compare a tuning voltage from a PLL to the first threshold voltage and control the steering current circuit based on the comparison; and wherein the lower bound comparator is configured to receive the second threshold voltage from the voltage window generator and compare the tuning voltage from a PLL to the second threshold voltage and control the steering current circuit based on the comparison.

Example 7

The signal generator of any one of Examples 1-6, further comprising a PLL comprising: a phase comparator/detector; and a loop filter coupled to the steering current circuit, the window comparator, and the phase comparator/detector, the loop filter comprising a loop filter capacitor, wherein the loop filter is configured to: receive the phase comparator/detector signal from the phase comparator/detector; and sink or source the steering current.

Example 8

The signal generator of Example 7, further comprising a reference oscillator coupled to the PLL.

Example 9

The signal generator of Example 7, wherein the steering current circuit comprises: a first switch configured to receive a first steering current control signal from the window comparator and to couple the steering current to the loop filter; a second switch configured to receive a second steering current control signal from the window comparator and to receive the steering current from the loop filter; a logic gate to receive the first steering current control signal and the second steering current control signal from the window comparator; and a third switch configured to receive an output of the logic gate and to couple the phase comparator/detector circuit to the loop filter.

Example 10

The signal generator of Example 7, wherein the loop filter further comprises: a loop filter capacitor configured to charge or discharge the steering current; and an amplifier coupled to the loop filter capacitor.

Example 11

The signal generator of Example 7, wherein the PLL further comprises a programmable counter coupled to the phase comparator/detector and coupled to the memory to receive a digital frequency control word stored in the memory.

Example 12

The signal generator of any one of Examples 1-11, further comprising an analog-to-digital converter (ADC) coupled to receive a VCO to receive a tuning voltage.

Example 13

A method of generating a signal, the method comprising: receiving, by a processor/logic, a frequency change request; loading, by the processor/logic, a frequency control word into a programmable counter circuit of a phase comparator/detector; loading, by the processor/logic, the frequency control word into a digital-to-analog converter (DAC) coupled to the processor/logic; controlling, by a steering current circuit, a steering current into or out of a loop filter capacitor portion of a loop filter coupled to the steering current circuit based on the frequency control word; and generating, by the loop filter, a tuning voltage based on the steering current.

Example 14

The method of Example 13, further comprising: generating, by a voltage window generator coupled to the DAC, the first and second reference threshold voltages; and comparing, by a window comparator coupled to the voltage window generator, the tuning voltage to the first and second reference threshold voltages.

Example 15

The method of Example 14, further comprising: determining, by the window comparator, that the tuning voltage is greater than the first reference threshold voltage; charging, by the steering current circuit, the loop filter capacitor with the steering current; and disconnecting, by the steering current circuit, the phase comparator/detector from the loop filter.

Example 16

The method of any one of Examples 14-15, further comprising: determining, by the window comparator, that the tuning voltage is less than the second reference threshold voltage; discharging, by the steering current circuit, the loop filter capacitor with the steering current; and disconnecting, by the steering current circuit, the phase comparator/detector from the loop filter.

Example 17

The method of any one of Examples 14-16, further comprising: determining, by the comparator, that the tuning voltage is less than or equal to the first reference threshold voltage and greater than or equal to the second reference threshold voltage; disabling, by the steering current circuit, the steering current; and applying, by the phase comparator/detector circuit, a phase comparator/detector signal to the loop filter.

Example 18

A signal generator, comprising: a processor/logic; a memory coupled to the processor/logic, the memory stores digital control words; a digital-to-analog converter (DAC) coupled to the memory circuit; a voltage window generator coupled to the DAC; a window comparator coupled to the voltage window generator circuit; a steering current circuit coupled to the window comparator; and a phase-lock-loop (PLL) circuit coupled to the memory and the steering current circuit, the PLL circuit further comprising: a programmable counter; a loop filter comprising a loop filter capacitor, the a loop filter coupled to the steering current circuit; a phase comparator/detector circuit; and a voltage controlled oscillator (VCO); wherein the memory stores digital instructions executable by the processor to: receive a frequency change request; load a frequency control word into the programmable counter circuit; and load the frequency control word into the DAC; wherein the steering current circuit is configured to control a steering current into or out of the loop filter capacitor based on the new frequency control word; and wherein the loop filter is configured to generate a tuning voltage based on the steering current.

Example 19

The signal generator of Example 18, wherein: the voltage window generator is configured to generate first and second reference threshold voltages; and the window comparator is configured to compare the tuning voltage to the first and second reference threshold voltages.

Example 20

The signal generator of Example 19, wherein: the window comparator is configured to determine that the tuning voltage is greater than the first reference threshold voltage; and the steering current circuit is configure to charge the loop filter capacitor with the steering current and disconnect the phase comparator/detector from the loop filter.

Example 21

The signal generator of any one of Examples 19-20, wherein: the window comparator is configured to determine that the tuning voltage is less than the second reference threshold voltage; and the steering current circuit is configured to discharge the loop filter capacitor with the steering current and disconnect the phase comparator/detector from the loop filter.

Example 22

The signal generator of any one of Examples 19-21, wherein: the comparator is configured to determine that the tuning voltage is less than or equal to the first reference threshold voltage and greater than or equal to the second reference threshold voltage; and the steering current circuit is configured to disable the steering current and apply a phase comparator/detector signal to the loop filter.

The invention claimed is:

1. A signal generator, comprising:
a voltage window generator to receive an analog frequency select signal from a digital-to-analog converter (DAC) and to generate a first reference threshold voltage and a second reference threshold voltage based on the analog frequency select signal;
a window comparator coupled to the voltage window generator, the window comparator to receive a voltage controlled oscillator (VCO) tuning voltage from a phase locked loop (PLL), receive the first and second reference threshold voltages from the voltage window generator, and generate a first steering current control signal and a second steering current control signal; and
a steering current circuit coupled to the window comparator, the steering current circuit to receive the first and second steering current control signals to control a steering current coupled to a PLL and apply a phase comparator/detector signal to an PLL based on the first and second steering current control signals.

2. The signal generator of claim 1, further comprising:
a memory coupled to the DAC, the memory to store the digital frequency control word; and
a DAC coupled to the memory and the voltage window generator, the DAC circuit to receive a digital frequency control word and generate the analog frequency select signal.

3. The signal generator of claim 1, wherein the voltage window generator comprises:
a first current mirror to generate the first reference threshold voltage;
a second current mirror to generate the second reference threshold voltage; and
a resistor coupled in series between the first and second current mirrors.

4. The signal generator of claim 3, wherein:
the first current mirror comprises a pair of PNP bi-polar junction (BJT) transistors; and
the second current mirror comprises a pair of NPN bi-polar junction transistors.

5. The signal generator of claim 3, wherein:
the first current mirror comprises a pair of P-channel MOS metal-oxide-silicon (MOS) transistors; and
the second current mirror comprises a pair of N-channel MOS transistors.

6. The signal generator of claim 1, wherein the window comparator comprises:
an upper bound comparator; and
a lower bound comparator;
wherein the upper bound comparator is configured to receive the first threshold voltage from the voltage window generator and compare a tuning voltage from a PLL to the first threshold voltage and control the steering current circuit based on the comparison; and
wherein the lower bound comparator is configured to receive the second threshold voltage from the voltage window generator and compare the tuning voltage from a PLL to the second threshold voltage and control the steering current circuit based on the comparison.

7. The signal generator of claim 1, further comprising a PLL comprising:
a phase comparator/detector; and
a loop filter coupled to the steering current circuit, the window comparator, and the phase comparator/detector, the loop filter comprising a loop filter capacitor, wherein the loop filter is configured to:

receive the phase comparator/detector signal from the phase comparator/detector; and
sink or source the steering current.

8. The signal generator of claim 7, further comprising a reference oscillator coupled to the PLL.

9. The signal generator of claim 7, wherein the steering current circuit comprises:
a first switch configured to receive a first steering current control signal from the window comparator and to couple the steering current to the loop filter;
a second switch configured to receive a second steering current control signal from the window comparator and to receive the steering current from the loop filter;
a logic gate to receive the first steering current control signal and the second steering current control signal from the window comparator; and
a third switch configured to receive an output of the logic gate and to couple the phase comparator/detector circuit to the loop filter.

10. The signal generator of claim 7, wherein the loop filter further comprises:
a loop filter capacitor configured to charge or discharge the steering current; and
an amplifier coupled to the loop filter capacitor.

11. The signal generator of claim 7, wherein the PLL further comprises a programmable counter coupled to the phase comparator/detector and coupled to the memory to receive a digital frequency control word stored in the memory.

12. The signal generator of claim 1, further comprising an analog-to-digital converter (ADC) coupled to receive a VCO to receive a tuning voltage.

13. A method of generating a signal, the method comprising:
receiving, by a processor/logic, a frequency change request;
loading, by the processor/logic, a frequency control word into a programmable counter circuit of a phase comparator/detector;
loading, by the processor/logic, the frequency control word into a digital-to-analog converter (DAC) coupled to the processor/logic;
controlling, by a steering current circuit, a steering current into or out of a loop filter capacitor portion of a loop filter coupled to the steering current circuit based on the frequency control word; and
generating, by the loop filter, a tuning voltage based on the steering current.

14. The method of claim 13, further comprising:
generating, by a voltage window generator coupled to the DAC, the first and second reference threshold voltages; and
comparing, by a window comparator coupled to the voltage window generator, the tuning voltage to the first and second reference threshold voltages.

15. The method of claim 14, further comprising:
determining, by the window comparator, that the tuning voltage is greater than the first reference threshold voltage;
charging, by the steering current circuit, the loop filter capacitor with the steering current; and
disconnecting, by the steering current circuit, the phase comparator/detector from the loop filter.

16. The method of claim 14, further comprising:
determining, by the window comparator, that the tuning voltage is less than the second reference threshold voltage;
discharging, by the steering current circuit, the loop filter capacitor with the steering current; and
disconnecting, by the steering current circuit, the phase comparator/detector from the loop filter.

17. The method of claim 14, further comprising:
determining, by the comparator, that the tuning voltage is less than or equal to the first reference threshold voltage and greater than or equal to the second reference threshold voltage;
disabling, by the steering current circuit, the steering current; and
applying, by the phase comparator/detector circuit, a phase comparator/detector signal to the loop filter.

18. A signal generator, comprising:
a processor/logic;
a memory coupled to the processor/logic, the memory stores digital control words;
a digital-to-analog converter (DAC) coupled to the memory circuit;
a voltage window generator coupled to the DAC;
a window comparator coupled to the voltage window generator circuit;
a steering current circuit coupled to the window comparator; and
a phase-lock-loop (PLL) circuit coupled to the memory and the steering current circuit, the PLL circuit further comprising:
a programmable counter;
a loop filter comprising a loop filter capacitor, the a loop filter coupled to the steering current circuit;
a phase comparator/detector circuit; and
a voltage controlled oscillator (VCO);
wherein the memory stores digital instructions executable by the processor to:
receive a frequency change request;
load a frequency control word into the programmable counter circuit; and
load the frequency control word into the DAC;
wherein the steering current circuit is configured to control a steering current into or out of the loop filter capacitor based on the new frequency control word; and
wherein the loop filter is configured to generate a tuning voltage based on the steering current.

19. The signal generator of claim 18, wherein:
the voltage window generator is configured to generate first and second reference threshold voltages; and
the window comparator is configured to compare the tuning voltage to the first and second reference threshold voltages.

20. The signal generator of claim 19, wherein:
the window comparator is configured to determine that the tuning voltage is greater than the first reference threshold voltage; and
the steering current circuit is configure to charge the loop filter capacitor with the steering current and disconnect the phase comparator/detector from the loop filter.

21. The signal generator of claim 19, wherein:
the window comparator is configured to determine that the tuning voltage is less than the second reference threshold voltage; and
the steering current circuit is configured to discharge the loop filter capacitor with the steering current and disconnect the phase comparator/detector from the loop filter.

22. The signal generator of claim 19, wherein:
the comparator is configured to determine that the tuning voltage is less than or equal to the first reference threshold voltage and greater than or equal to the second reference threshold voltage; and
the steering current circuit is configured to disable the steering current and apply a phase comparator/detector signal to the loop filter.

\* \* \* \* \*